US012085124B2

(12) United States Patent
Hua et al.

(10) Patent No.: US 12,085,124 B2
(45) Date of Patent: Sep. 10, 2024

(54) BEARING ASSEMBLY FOR ACCOMMODATING DEVICE FOR SEMICONDUCTOR APPARATUS

(71) Applicant: ZHICHENG SEMICONDUCTOR EQUIPMENT TECHNOLOGY (KUNSHAN) CO., LTD., Suzhou (CN)

(72) Inventors: Bin Hua, Suzhou (CN); Xianmiao Sun, Suzhou (CN); Xinyu Shi, Suzhou (CN); Wenxuan Li, Suzhou (CN)

(73) Assignee: ZHICHENG SEMICONDUCTOR EQUIPMENT TECHNOLOGY (KUNSHAN) CO., LTD., Suzhou (CN)

( * ) Notice: Subject to any disclaimer, the term of this patent is extended or adjusted under 35 U.S.C. 154(b) by 0 days.

(21) Appl. No.: 17/918,223

(22) PCT Filed: Aug. 9, 2022

(86) PCT No.: PCT/CN2022/111084
§ 371 (c)(1),
(2) Date: Oct. 11, 2022

(87) PCT Pub. No.: WO2023/045596
PCT Pub. Date: Mar. 30, 2023

(65) Prior Publication Data
US 2024/0209893 A1 Jun. 27, 2024

(30) Foreign Application Priority Data
Sep. 27, 2021 (CN) .......................... 202111132436.2

(51) Int. Cl.
H01L 21/67 (2006.01)
F16C 19/36 (2006.01)
H01L 21/673 (2006.01)

(52) U.S. Cl.
CPC ........ F16C 19/36 (2013.01); H01L 21/67057 (2013.01); H01L 21/67326 (2013.01)

(58) Field of Classification Search
CPC ......... H01L 21/67057; H01L 21/67086; H01L 21/67313; H01L 21/67326
See application file for complete search history.

(56) References Cited

U.S. PATENT DOCUMENTS

2016/0322244 A1* 11/2016 Chang ............... H01L 21/67326

FOREIGN PATENT DOCUMENTS

| CN | 206059357 U | 5/2002 |
|----|-------------|--------|
| CN | 111613554 A | 9/2020 |

(Continued)

Primary Examiner — David G Cormier
(74) Attorney, Agent, or Firm — CBM PATENT CONSULTING, LLC

(57) ABSTRACT

A bearing assembly includes a bearing cantilever, a supporting assembly connected to the bearing cantilever and a first driving device, where the bearing cantilever includes a bearing portion for bearing the semiconductor apparatus accommodating device, a connecting plate and a substrate, the bearing portion being composed of a bearing plate and a bearing support that are horizontally inserted, an opening for exposing a semiconductor apparatus is formed at a bottom of the semiconductor apparatus accommodating device, the bearing plate is provided with a rotatable rotating roller located below the opening, the rotating roller makes contact with an edge of the semiconductor apparatus, and the first driving device drives the rotating roller to rotate by means of a power transmission member, so as to apply a rotating force by means of the rotating roller, to an edge of the semiconductor apparatus inserted into the semiconductor apparatus accommodating device.

20 Claims, 18 Drawing Sheets

(56) References Cited

FOREIGN PATENT DOCUMENTS

| CN | 212412013 U | 1/2021 |
|----|-------------|--------|
| JP | 2002141321 A | 5/2002 |

* cited by examiner

BEARING ASSEMBLY FOR ACCOMMODATING DEVICE FOR SEMICONDUCTOR APPARATUS

TECHNICAL FIELD

The present disclosure relates to the technical field of semiconductor apparatus manufacturing apparatuses, and in particular to a bearing assembly for a semiconductor apparatus accommodating device.

BACKGROUND ART

A semiconductor apparatus is finally formed on a substrate such as a semiconductor wafer (such as silicon, germanium, gallium nitride, gallium arsenide, silicon carbide and indium phosphide) or an organic light emitting diode (OLED) glass substrate by repeatedly executing semiconductor processes such as spin coating, exposure, development, etching, coating and ion implantation. In the semiconductor manufacturing process of the semiconductor apparatus, it is necessary to repeatedly execute cleaning treatment, so as to remove residual chemical glue (such as photoresist (PR)) and particles on the substrate. The cleaning process is usually completed by using a tank type cleaning apparatus, and the cleaning apparatus can also be used in a wet etching process for a wafer. Therefore, the cleaning apparatus is one of key apparatuses in the process of manufacturing the semiconductor apparatus.

The semiconductor cleaning apparatus for tank type cleaning or wet etching usually includes a wafer box or a wafer cassette for accommodating a wafer and a bearing device for bearing the wafer box. The wafer is accommodated in the wafer box and is integrally immersed in a cleaning solution (such as a buffered oxide etch (BOE) cleaning solution containing hydrofluoric acid, deionized water and a surfuric/peroxide mix (SPM) cleaning solution containing concentrated sulfuric acid and hydrogen peroxide), to execute cleaning operation, and after cleaning or wet etching is completed, the wafer box is transferred by means of a wafer box transferring mechanical arm. However, since a side edge of the wafer makes contact with a comb tooth wall of the wafer box, a wafer edge side surface and a wafer edge side wall surface which are inserted and clamped between comb tooth walls of the wafer box (which is a subordinate concept of a semiconductor apparatus accommodating device) have the defect of a poor cleaning effect. Moreover, a bonding force between the chemical glue (such as the photoresist) and the particles and silicon atoms forming a microstructure of the wafer and a surface of the wafer is strong, such that the effect of executing cleaning or wet etching by traditionally immersing the wafer box in a cleaning tank is poor. Finally, when an ultrasonic generator or a megasonic generator is used to generate ultrasonic or megasonic cleaning for the wafer immersed in the cleaning solution, although the chemical glue and the particles on the surface of the wafer can be emulsified and vibrated, it is necessary to heat the cleaning solution and match a special cleaning solution in the prior art, such that the cleaning cost of the wafer is increased, and since ultrasonic waves or megasonic waves can damage a metal film and a substrate which are bonded on the basis of a Van der Waals' force and strip the metal film and the substrate, potential damage can further be caused to a microscopic device on the surface of the wafer.

In view of this, it is necessary to improve a bearing assembly for a semiconductor apparatus accommodating device in the prior art, so as to solve the above problem.

SUMMARY

The objective of the present disclosure is to disclose a bearing assembly for a semiconductor apparatus accommodating device, which solves the technical problem that in a process of executing cleaning treatment or wet etching treatment on a semiconductor apparatus vertically inserted into a plurality of clamping grooves oppositely provided in an accommodating device in cleaning tanks, chemical glue and particles may not effectively removed from an edge in which the semiconductor apparatus makes contact with inner wall surfaces of the clamping grooves, improves cleaning and wet etching effects of the semiconductor apparatus, and moreover, avoids the situation that damage is caused to a microscopic device formed in the semiconductor apparatus by using ultrasonic waves or megasonic waves in a cleaning or wet etching process, and avoids the undesirable phenomenon that a metal film is stripped from a substrate.

In order to achieve the above objective, the present disclosure provides a bearing assembly for a semiconductor apparatus accommodating device. The bearing assembly is used for bearing the semiconductor apparatus accommodating device, and
  includes: a bearing cantilever, a supporting assembly connected to the bearing cantilever and a first driving device, where
  the bearing cantilever includes: a bearing portion for bearing the semiconductor apparatus accommodating device, a connecting plate and a substrate, the bearing portion being composed of a bearing plate and a bearing support that are horizontally inserted, an opening for exposing a semiconductor apparatus being formed at a bottom of the semiconductor apparatus accommodating device, the bearing plate being provided with a rotatable rotating roller located below the opening, the rotating roller making contact with an edge of the semiconductor apparatus, and the first driving device driving the rotating roller to rotate by means of a power transmission member, so as to apply a rotating force by means of the rotating roller, to an edge of the semiconductor apparatus inserted into the semiconductor apparatus accommodating device.

As a further improvement of the present disclosure, a cambered surface is formed by the rotating roller in a lengthwise extension direction of the rotating roller, so as to apply a rotating force by means of the cambered surface, to the edge of the semiconductor apparatus inserted into the semiconductor apparatus accommodating device.

As a further improvement of the present disclosure, at least one plane is formed by the cambered surface formed by the rotating roller in the lengthwise extension direction of the rotating roller, so as to apply a rotating force by means of the cambered surface and the plane, to the edge of the semiconductor apparatus inserted into the semiconductor apparatus accommodating device, and the cambered surface and the plane make alternate contact with the edge of the semiconductor apparatus in a rotating process of the rotating roller, so as to drive the semiconductor apparatus to vertically move periodically.

As a further improvement of the present disclosure, a plurality of planes are formed by the rotating roller in a lengthwise extension direction of the rotating roller, and make alternate contact with the edge of the semiconductor apparatus in a rotating process of the rotating roller, so as to drive the semiconductor apparatus to vertically move periodically.

As a further improvement of the present disclosure, a bottom of the connecting plate is provided with several positioning stepped holes continuously provided, a positioning seat for limiting longitudinal displacement of the rotating roller is arranged at a tail end of the bearing plate away from the connecting plate, a first rolling member embedded into the positioning stepped holes is arranged at an end of the rotating roller close to the connecting plate, the rotating roller is longitudinally clamped by the positioning seat and the connecting plate, and the positioning stepped holes are distributed in an arc shape.

As a further improvement of the present disclosure, the bearing assembly further includes a cambered fixing plate that the rotating roller vertically penetrates, where the cambered fixing plate is connected to the connecting plate.

As a further improvement of the present disclosure, the rotating roller includes an inner roller body, an elastic outer roller body annularly arranged on an outer side of the inner roller body, a roller shaft base annularly arranged in a protruding manner, and a core shaft longitudinally penetrating the inner roller body and the roller shaft base, where a positioning end inserted into the driven gear is formed by a tail end of the roller shaft base, the driven gear is inserted into a positioning shaft arranged coaxial with the core shaft, and the positioning shaft vertically penetrates the cambered fixing plate and is inserted into the first rolling member.

As a further improvement of the present disclosure, the power transmission member includes a driving gear driven by the first driving device, a driven gear arranged on an outer side of the roller shaft base in a sleeving manner and at least one carrier gear meshing with the driving gear and the driven gear, the carrier gear being fixed to the connecting plate.

As a further improvement of the present disclosure, the power transmission member includes a driving gear driven by the first driving device, a driven gear arranged on the outer side of the roller shaft base in a sleeving manner, and a synchronous belt meshing with the driving gear and the driven gear.

As a further improvement of the present disclosure, the connecting plate and the supporting assembly are vertically arranged and separated in parallel.

As a further improvement of the present disclosure, the first driving device is fixed to a top of the supporting assembly, and a driving shaft arranged horizontally, extending through the connecting plate and driving the driving gear is formed by the first driving device.

As a further improvement of the present disclosure, the bearing assembly further includes: a cover plate and a back plate that are separated in parallel and are slidably connected to each other, a vertical abutting plate vertically inserted between the cover plate and the back plate and fixedly connected to the back plate, and a vibration mechanism, where
the vibration mechanism integrally drives the back plate and the vertical abutting plate to vertically reciprocate relative to the cover plate, so as to integrally drive the bearing cantilever to vertically reciprocate.

As a further improvement of the present disclosure, a first cambered notch is formed by the substrate, an abutting plate is arranged at a top of the vertical abutting plate, a second cambered notch is formed by the abutting plate, an opening portion is delimited by the first cambered notch and the second cambered notch, and a waist-shaped plate is arranged at the opening portion, so as to connect the substrate and the abutting plate by means of the waist-shaped plate.

As a further improvement of the present disclosure, the vibration mechanism includes: a second driving device, a driving rotary disc, a driving shaft eccentrically penetrating the driving rotary disc, a second rolling member making rolling contact along an annular surface of the driving rotary disc, and a driving plate fixedly connected to the back plate, where
the second rolling member is provided with a driven shaft inserted into a pin hole formed at a bottom of a driving plate; and one end of the driving shaft vertically penetrates a middle plate, and the other end of the driving shaft is driven by the second driving device.

As a further improvement of the present disclosure, several sliders are symmetrically arranged on one side of the back plate facing the cover plate, the middle plate fixedly connected to the cover plate is clamped between the cover plate and the back plate, and a guide rail slidably connected to the sliders is arranged on the middle plate in a vertical direction; and
a first-stage step and a second-stage step that are gradually shrunk are formed by one end of the driving shaft, the second-stage step is embedded into a limiting hole formed by the middle plate, a cylinder is formed by the other end of the driving shaft, and a pin hole for insertion of a power output shaft formed by the second driving device is formed by a circle center of the cylinder.

As a further improvement of the present disclosure, the driven shaft includes: a base, the base sleeving the second rolling member in an embedded manner; a retainer ring arranged on the base in a sleeving manner and stopping the second rolling member from stripping; a rotating shaft extending from the base, gradually shrunk and inserted into the pin hole; a limiting ring embedded into the pin hole and having a through hole; and a fastener,
the fastener transversely and continuously penetrating the limiting ring and the pin hole and being screwed into a blind hole provided at an end surface of the rotating shaft and having an internal thread, so as to rotatably connect the driven shaft and the driving plate.

As a further improvement of the present disclosure, one side of the middle plate facing the vibration mechanism is provided with four stand columns arranged around the driving rotary disc; and the second driving device includes a second electric motor, a reversing device and an electric motor mounting plate, a core shaft perpendicular to the electric motor mounting plate being arranged in the reversing device, the core shaft being inserted into the pin hole, and the driving shaft being clamped by the second driving device and the middle plate.

As a further improvement of the present disclosure, a lower limit position sensor and an upper limit position sensor are arranged on a side portion of a bottom of the middle plate, and a blocking piece is arranged at a bottom of the back plate; and
the second driving device drives the driving rotary disc to periodically rotate around the driving shaft, so as to drive the second rolling member to roll along the annular surface of the driving rotary disc by means of the driving rotary disc, so as to drive the back plate to vertically reciprocate by means of the driven shaft and the driving plate, so as to integrally drive the bearing cantilever to vertically reciprocate.

As a further improvement of the present disclosure, the lower limit position sensor and the upper limit position sensor are movably embedded into an adjusting support arranged at a side portion of a bottom of the middle plate, the adjusting support is provided with a strip-shaped opening allowing the lower limit position sensor and the upper limit position sensor to vertically slide in a vertical direction, and an amplitude of vertical reciprocating motion of the bearing cantilever is determined by adjusting a distance between the lower limit position sensor and the upper limit position sensor.

As a further improvement of the present disclosure, an upper surface of the bearing plate is provided with four first positioning members and four second positioning members arranged on outer sides of the first positioning members, and a positioning groove is provided on each of outer sides of the second positioning members on the bearing plate in a recessed manner.

As a further improvement of the present disclosure, the semiconductor apparatus accommodating device born by the bearing assembly includes a wafer cassette clamping a four-inch wafer, a six-inch wafer, or an eight-inch wafer, an opening for exposing the four-inch wafer, the six-inch wafer, or the eight-inch wafer being formed at a bottom of the wafer cassette.

On the basis of the same inventive concept, the present disclosure further discloses a semiconductor apparatus cleaning device. The semiconductor apparatus cleaning device includes:

several cleaning tanks forming accommodating cavities, housings delimiting the cleaning tanks, and several bearing assemblies for semiconductor apparatus accommodating devices of any one of the above inventive creations fixedly connected to the housings, where bearing cantilevers in the bearing assemblies for semiconductor apparatus accommodating devices extend into the accommodating cavities of the cleaning tanks.

Compared with the prior art, the present disclosure has the beneficial effects:

firstly, the opening for exposing the semiconductor apparatus is formed at the bottom of the semiconductor apparatus accommodating device on the bearing plate for bearing the semiconductor apparatus accommodating device, and the rotatable rotating roller is arranged below the opening on the bearing plate, such that the objective that in a process of executing cleaning treatment or wet etching treatment, the rotating force is applied by means of the rotating roller, to the edge of the semiconductor apparatus inserted into the semiconductor apparatus accommodating device, so as to make the semiconductor apparatus rotate in the clamping groove of the semiconductor apparatus accommodating device, it is ensured that in a semiconductor manufacturing process of executing wet etching or cleaning on the semiconductor apparatus, part of an area in which the semiconductor apparatus makes contact with the clamping groove of the semiconductor apparatus accommodating device may be completely exposed, such that the technical problem that chemical glue and particles may not be effectively removed from the edge in which the semiconductor apparatus makes contact with the inner wall surface of the clamping groove is effectively solved, and a cleaning treatment effect of the semiconductor apparatus and uniformity of wet etching are improved;

secondly, in the present disclosure, the vibration mechanism integrally drives the back plate and the vertical abutting plate to vertically reciprocate relative to the cover plate, so as to integrally drive the bearing cantilever, to vertically reciprocate, such that the semiconductor apparatus does vertical reciprocating motion on the basis of the bearing cantilever in the process of executing wet etching or cleaning, so as to drive the semiconductor apparatus accommodating device born by the bearing plate to vertically reciprocate, and the semiconductor apparatus clamped in the semiconductor apparatus accommodating device vertically vibrates, such that chemical glue and particles attached to a surface of the semiconductor apparatus are vibrated off favorably, and the effects of semiconductor manufacturing processes such as wet etching and cleaning of the semiconductor apparatus are improved; and finally, the bearing assembly for a semiconductor apparatus accommodating device disclosed in the present disclosure does not need to depend on a cleaning tank for mounting an ultrasonic or megasonic generator, such that the situation that damage is caused to a microscopic device formed in the semiconductor apparatus by using ultrasonic waves or megasonic waves in the cleaning or wet etching process is effectively avoided, and the undesirable phenomenon that a metal film is stripped from a substrate is avoided.

DETAILED DESCRIPTION OF THE EMBODIMENTS

Figure 1:
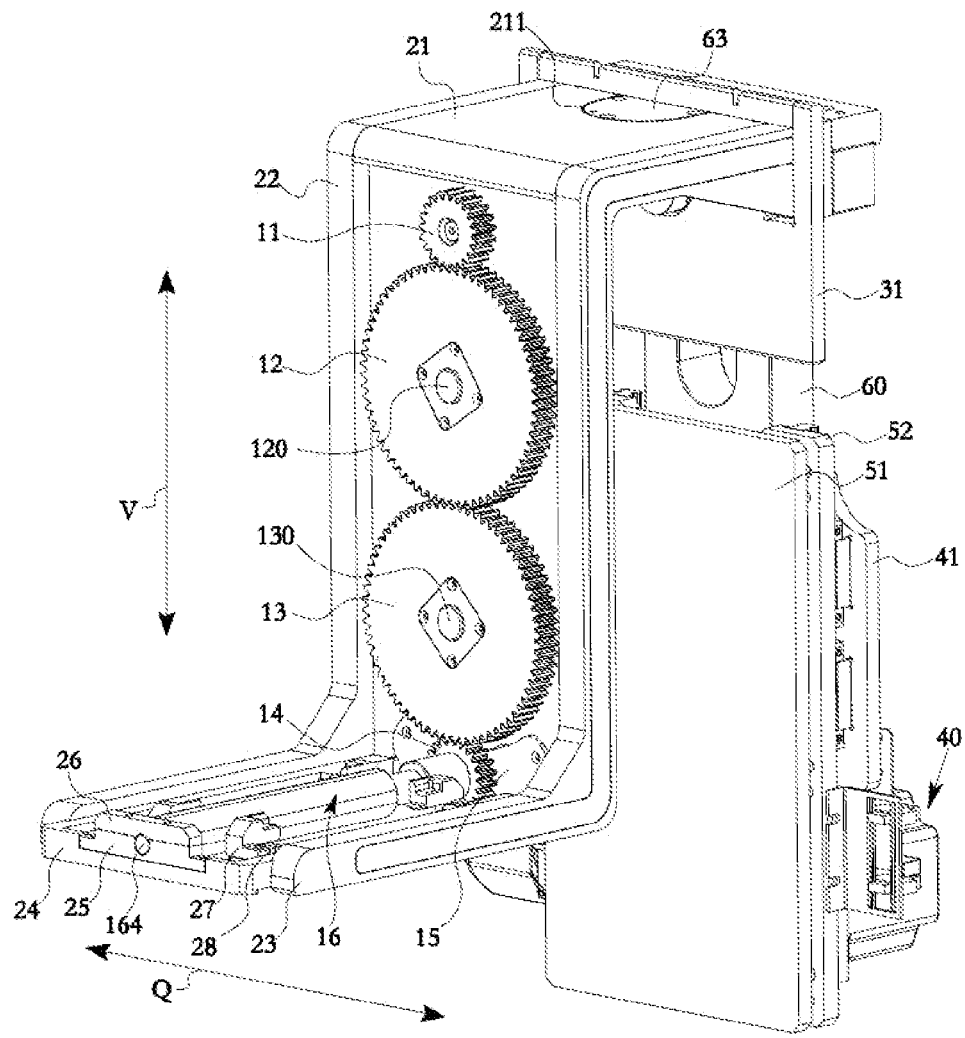
FIG. 1 is a solid diagram of a bearing assembly for a semiconductor apparatus accommodating device of the present disclosure in one angle of view.

The present disclosure will be described in detail below in combination with the implementations shown in the accompanying drawings. However, it should be noted that these implementations are not a limitation of the present disclosure, and equivalent transformation or substitution of functions, methods, or structures made by those of ordinary skill in the art according to these implementations all fall within the scope of protection of the present disclosure.

It should be noted that when an element is considered to be "connected" to another element, the element may be directly connected to another element or there may be an intermediate element simultaneously. Unless otherwise defined, all technical and scientific terms used herein have the same meaning as commonly understood by those skilled in the technical field of the present disclosure. The terms used in the description of the present disclosure herein are just for the purpose of describing particular embodiments, and are not intended to limit the present disclosure. As used herein, the term "and/or" includes any and all combinations of one or more relevant listed items.

It needs to be understood that the terms "central", "longitudinal", "upper", "lower", "front", "back", "left", "right", "vertical", "horizontal", "clockwise", "anticlockwise", "axial", "radial", "circumferential", "forward", "negative", etc. indicate azimuthal or positional relations on the basis of those shown in the drawings only for ease of description of the present technical solution and for simplicity of description, and are not intended to indicate or imply that the referenced device or element must have a particular orientation and be constructed and operative in a particular orientation, and thus may not be construed as a limitation on the present technical solution.

Embodiment 1

With reference to a specific implementation of a bearing assembly (hereinafter or referred to as "bearing assembly") for a semiconductor apparatus accommodating device of the present disclosure shown in FIGS. 1-18, the bearing assembly is used for bearing the semiconductor apparatus accommodating device of an opening for exposing a semiconductor apparatus formed at a bottom of a wafer cassette, etc., such as a wafer cassette 83 (which is a subordinate concept of the semiconductor apparatus accommodating device) shown in FIG. 15 and used for clamping a four-inch wafer, a wafer cassette 82 (which is a subordinate concept of the semiconductor apparatus accommodating device) shown in FIG. 16 and used for clamping a six-inch wafer, or a wafer cassette 81 (which is a subordinate concept the semiconductor apparatus accommodating device) shown in FIG. 17 and used for clamping an eight-inch wafer. The semiconductor apparatus involved in this embodiment includes, but not limited to, a semiconductor apparatus (such as a wafer) made of a silicon-based semiconductor material, a semiconductor apparatus made of emerging semiconductor materials having the characteristic of a wide bandgap (Eg >2.3 eV), such as silicon carbide (SiC), gallium nitride (GaN), zinc oxide (ZnO), diamond (C) and aluminum nitride (AlN), a glass-based semiconductor apparatus, etc., and has the appearance generally in the shape of a flake-like circle or a similar circle. The wafer cassette 83 may be integrally clamped into the wafer cassette 82, and the wafer cassette 82 may be integrally clamped into the wafer cassette 81, as shown in FIG. 6 for details.

Figure 15:
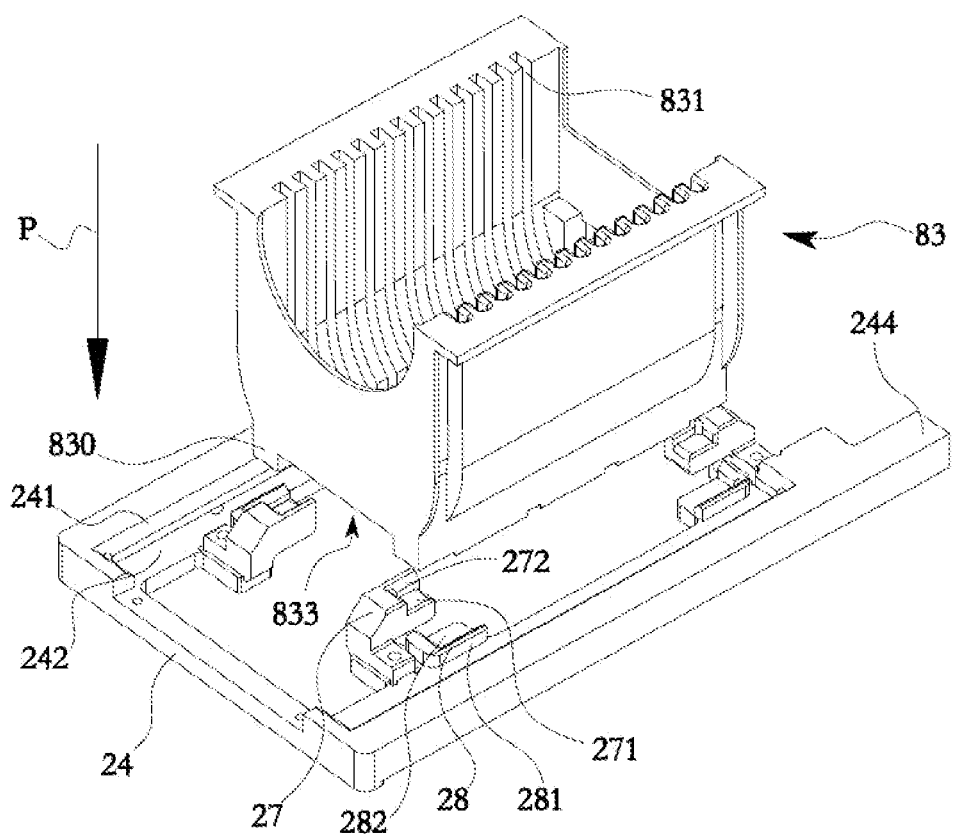
FIG. 15 is a solid diagram of a bearing plate bearing and clamping a four-inch wafer cassette (which is a subordinate concept of a semiconductor apparatus accommodating device)
Figure 16:
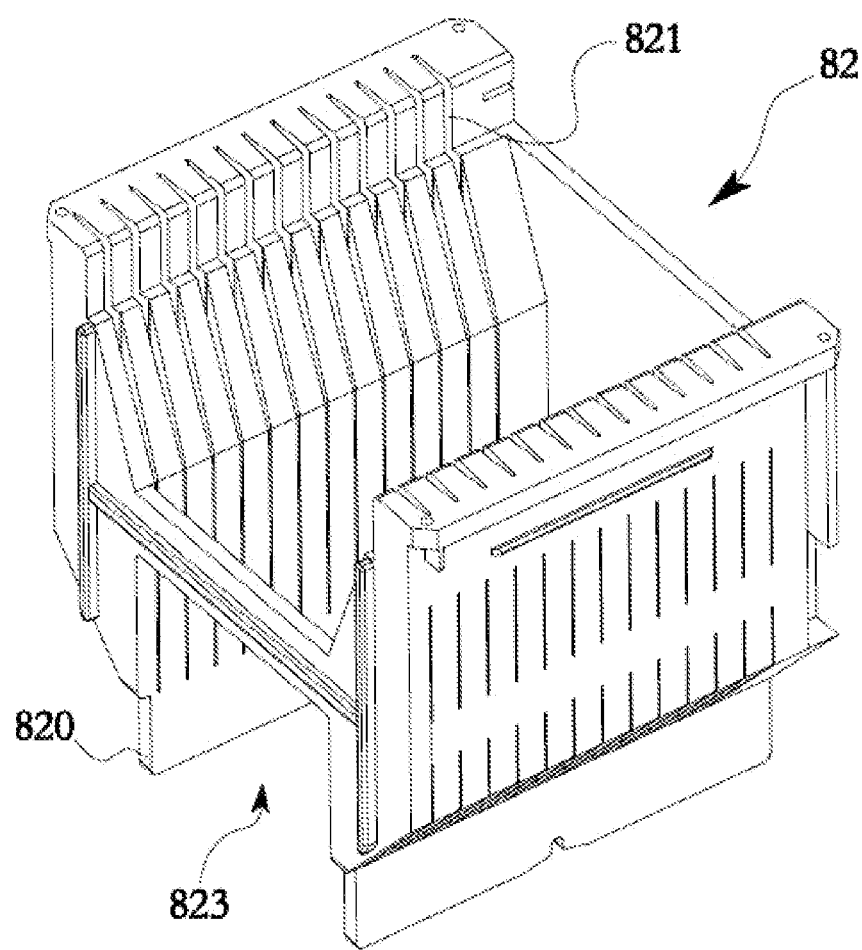
FIG. 16 is a solid diagram of a bearing plate bearing and clamping a six-inch wafer cassette (which is a subordinate concept of a semiconductor apparatus accommodating device)
Figure 17:
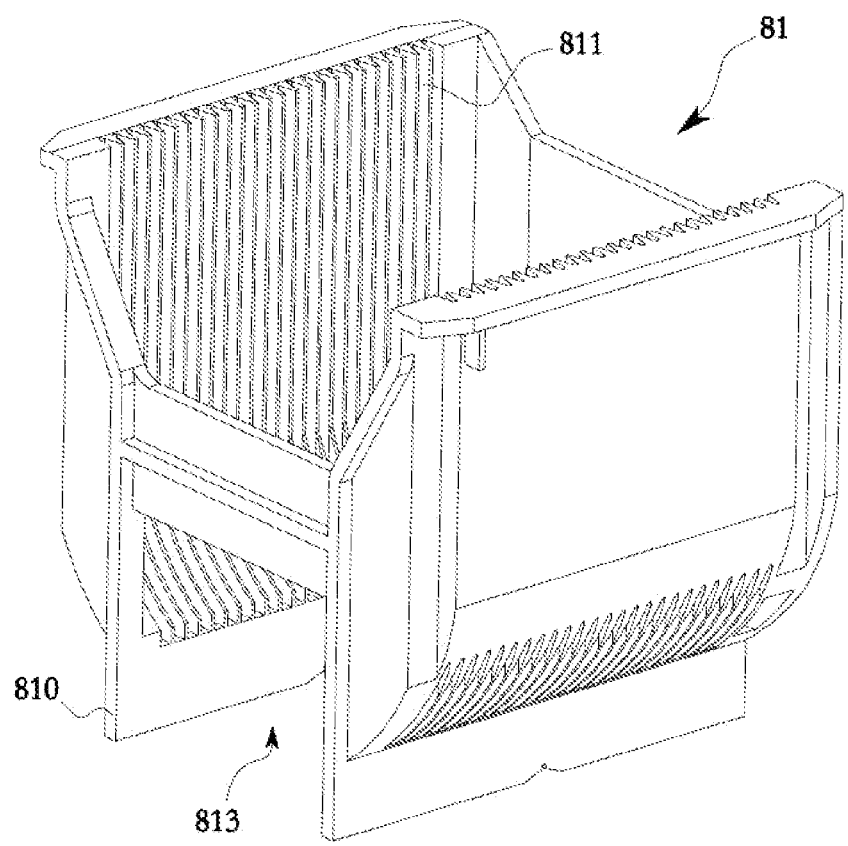
FIG. 17 is a solid diagram of a bearing plate bearing and clamping an eight-inch wafer cassette (which is a subordinate concept of a semiconductor apparatus accommodating device)

With reference to FIGS. 15-17, the semiconductor apparatus accommodating device 80 born by the bearing assembly includes wafer cassettes 83-81 that clamp a four-inch wafer, a six-inch wafer, or an eight-inch wafer, openings for exposing the four-inch wafer, the six-inch wafer, or the eight-inch wafer being formed at bottoms of the wafer cassettes. An opening 833 for exposing a semiconductor apparatus (such as wafer 1) is formed by a bottom of the wafer cassette 83, an opening 823 for exposing the semiconductor apparatus (such as wafer 1) is formed by a bottom of the wafer cassette 82, and an opening 813 for exposing the semiconductor apparatus (such as wafer 1) is formed by a bottom of the wafer cassette 81. The bearing assembly bears the wafer cassettes 83-81, the wafer cassettes 83-81 accommodate cambered side edges of wafers (which is a subordinate concept of the semiconductor apparatus) by means of a plurality of regularly-provided clamping grooves 831, 821 or 811 on side walls of the wafer cassettes, and the wafer cassettes 83-81 are integrally immersed in an accommodating cavity of a cleaning tank 90. The cleaning tank 90 may be connected to a supply pipe, a discharge pipe, and an overflow pipe of a cleaning solution, which is not specifically shown and described in this embodiment in view of the prior art in which the cleaning tank 90 is connected to the supply pipe, the discharge pipe, and the overflow pipe.

The cleaning solution is contained in the cleaning tank 90, so as to execute wet etching or cleaning treatment. Specifically, the cleaning solution includes, but not limited to, a buffered oxide etch (BOE) solution formed by mixing HF and NH4F in different proportions, a surfuric/peroxide mix (SPM) solution (a mixed solution of concentrated sulfuric acid and water), an SC-1 solution (a mixed solution of NH4OH and H2O2), an SC-2 solution (a mixed solution of HCl, H2O2 and H2O), an aluminum etching agent (a mixed solution of phosphoric acid, nitric acid and acetic acid), a phosphoric acid etching solution (a mixed solution of pure phosphoric acid and deionized water) or deionized water.

In this embodiment, the bearing assembly for a semiconductor apparatus accommodating device is used for accommodating the semiconductor apparatus accommodating device 80, and includes: a bearing cantilever, a supporting assembly connected to the bearing cantilever and a first driving device 30.

The bearing cantilever includes: a bearing portion for bearing the semiconductor apparatus accommodating device, a connecting plate 22 and a substrate 21, where the bearing portion is composed of a bearing plate 24 and a bearing support 23 that are horizontally inserted, an opening for exposing a semiconductor apparatus is formed at a bottom of the semiconductor apparatus accommodating device, the bearing plate 24 is provided with a rotatable rotating roller 16 located below the opening, the rotating roller 16 making contact with an edge of the semiconductor apparatus, and the first driving device 30 drives the rotating roller 16 to rotate by means of a power transmission member, so as to apply a rotating force by means of the rotating roller, to an edge of the semiconductor apparatus inserted into the semiconductor apparatus accommodating device 16. The bearing portion, the connecting plate 22, the substrate 21, a driving gear 11, a carrier gear or a driven gear 14, etc. disclosed in this embodiment are all made of weather-resistant materials (such as polytetrafluoroethylene and polypropylene) having acid and alkali corrosion resistance.

Figure 2:
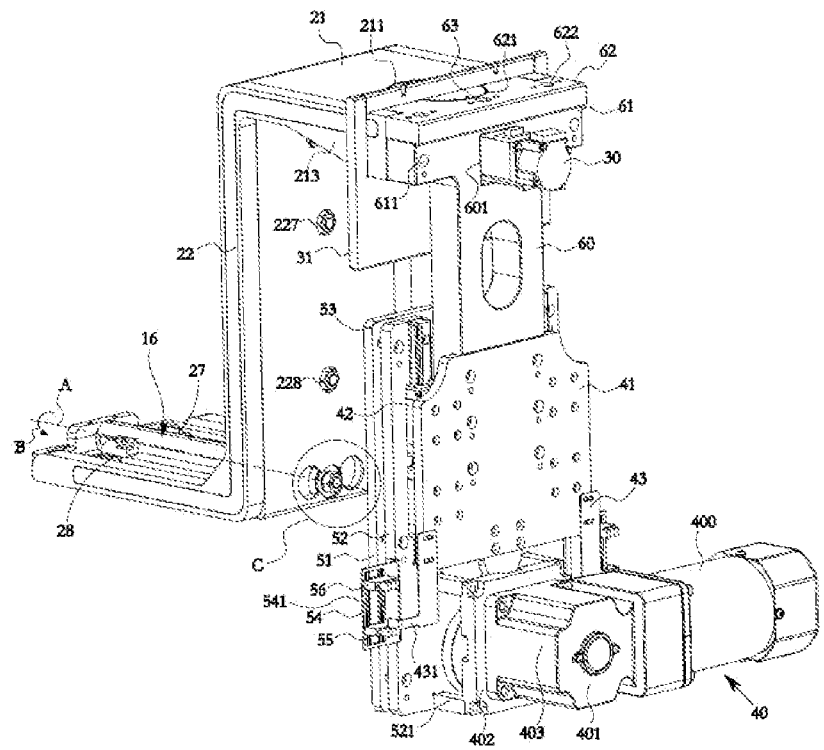
FIG. 2 is a solid diagram of the bearing assembly for a semiconductor apparatus accommodating device of the present disclosure in another angle of view.
Figure 10:
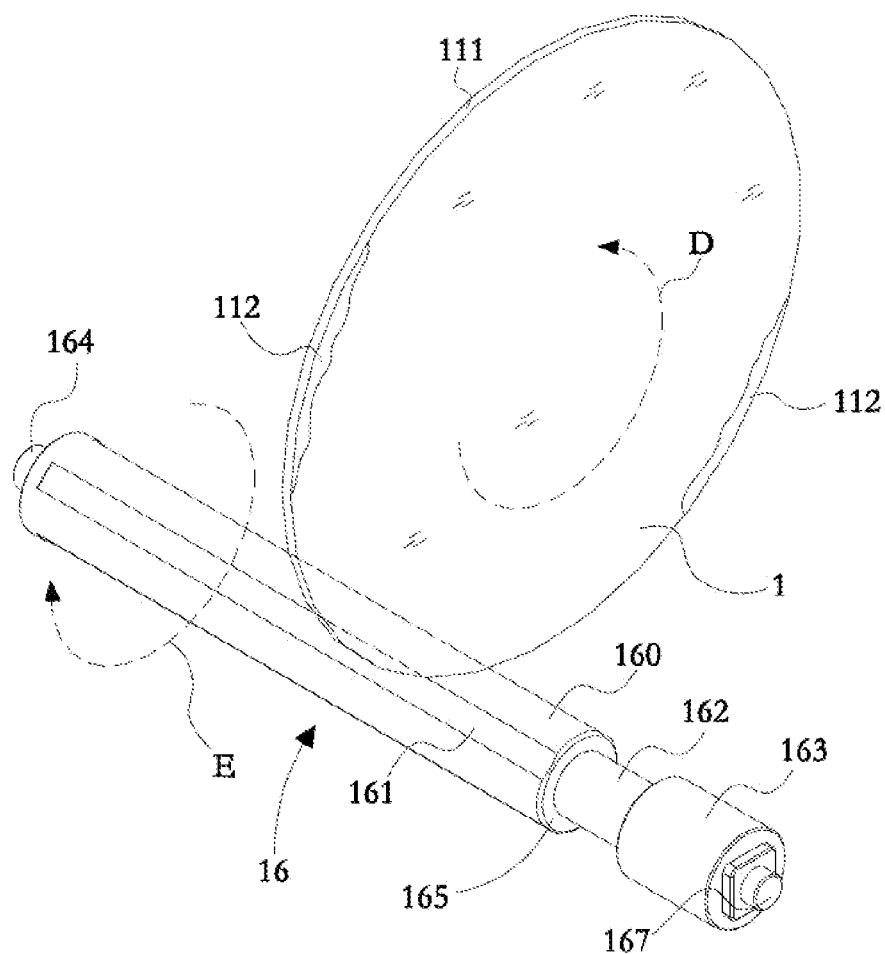
FIG. 10 is a schematic diagram of a wafer clamped in a wafer cassette in a vertical posture by applying a rotating force to an edge of the wafer (which is a subordinate concept of a semiconductor apparatus) by a rotating roller in a cleaning process, to drive the wafer to rotate.

In brief, with reference to FIGS. 2 and 10, a cambered surface is formed by the rotating roller 16 in a lengthwise extension direction (i.e., a direction shown by an axis A in FIG. 2) of the rotating roller, so as to apply a rotating force by means of the cambered surface, to the edge of the semiconductor apparatus 111 inserted into the semiconductor apparatus accommodating device 80, and the rotating force is applied to the edge 111 of the wafer 1 in a tangent direction of the edge 111 of the wafer 1 in FIG. 10, to drive the wafer 1 to rotate in the semiconductor apparatus accommodating device 80 (such as the wafer cassettes 83-81) in a posture perpendicular to the rotating roller 16. A cross-sectional (i.e., a plane perpendicular to an axis A) shape of the rotating roller 16 includes, but not limited to, a circle, oval, drop shape, etc.

Further, at least one plane 161 is formed by a cambered surface 160 formed by the rotating roller 16 in a lengthwise extension direction (in a direction shown by an axis A in FIG. 2) of the rotating roller. Preferably, four planes 161 are formed by the cambered surface 160 formed by the rotating roller 16 in the lengthwise extension direction of the rotating roller, so as to apply a rotating force to an edge 111 of the semiconductor apparatus (such as the wafer 1 shown in FIG. 10, the wafer 1 being a subordinate concept of the semiconductor apparatus) inserted into the wafer cassettes 83-81 by means of the cambered surface 160 and the four alternately-arranged planes 161, and in a horizontal rotation process of the rotating roller 16, and the cambered surface 160 and the four alternately-arranged planes 161 make alternate contact with the edge 111 of the wafer 1, such that an acting force in a vertical direction is applied to the wafer 1 in the vertical direction of the wafer 1 while a rotation process of the wafer 1 is achieved, and the wafer 1 is driven to vertically move periodically in the vertical direction (with reference to a direction shown by a double-sided arrow K in FIG. 5), such that a vibration effect on the wafer 1 is achieved. The rotating roller 16 may rotate in a direction of an arrow B in FIG. 2, and certainly, may also rotate in a direction opposite the arrow B, so as to apply a rotating force to the edge 111 formed in a thickness direction of the wafer 1 by means of a cambered surface 160 and/or a plane 161 having a circular cross section of the rotating roller 16, so as to execute synchronous rotation on a plurality of wafers 1 inserted and accommodated in the wafer cassettes 83 (or the wafer cassette 82 or the wafer cassette 81).

Specifically, when the rotating roller 16 rotates in a direction of an arrow E in FIG. 10, the wafer 1 rotates in a direction shown by an arrow D in FIG. 10, and the edge 111 of the wafer 1 always makes contact with the cambered surface 160 and/or the plane 161 having a circular cross section of the rotating roller 16 in a rotation process of the wafer 1. As another reasonable variation of the rotating roller 16 in this embodiment, several ribs (not shown) distributed in parallel in the direction of the axis A and annularly arranged around the cambered surface 160 may further be arranged on the cambered surface 160 in the longitudinal extension direction of the rotating roller (i.e. the direction of the axis A). Alternatively, several ribs spirally distributed around the direction of the axis A may further be arranged on the cambered surface 160 of the rotating roller 16 in the lengthwise extension direction (i.e., the direction of the axis A) of the rotating roller, the ribs protrude out of the cambered surface 160 in a radial direction, and a cross-sectional shape of the ribs includes a semi-circular shape or a triangular shape.

Figure 18:
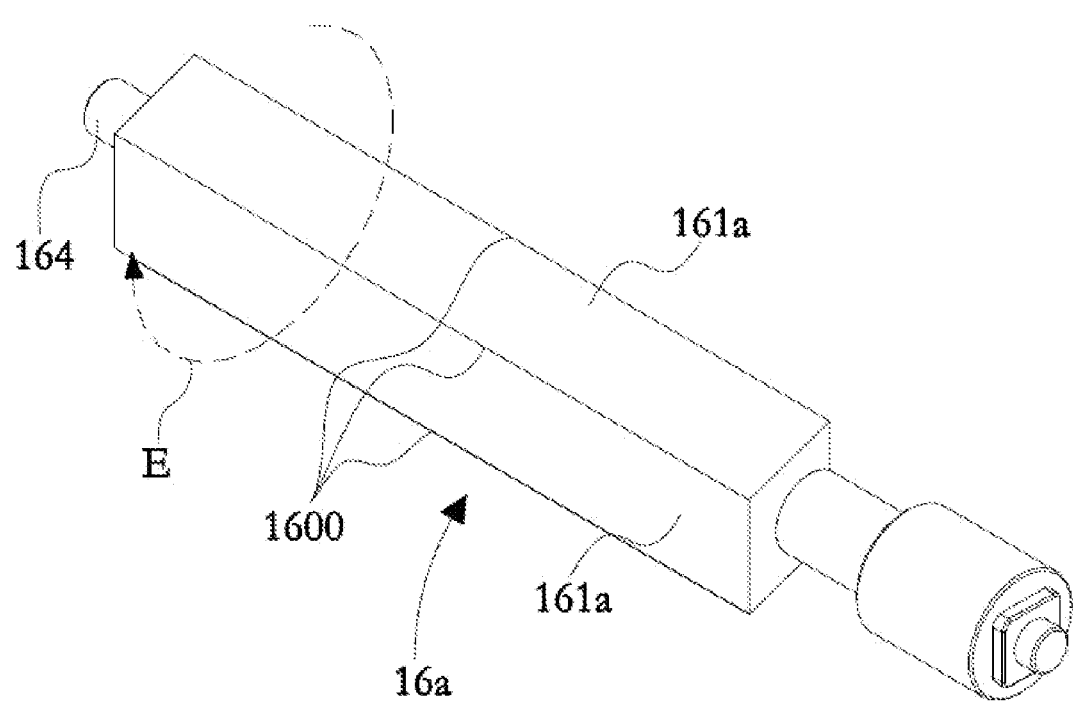
FIG. 18 is a solid diagram of a rotating roller in a variation example.

As shown in FIG. 18, as a reasonable variation of the above rotating roller 16, this embodiment further discloses a rotating roller 16a. A plurality of planes are formed by the rotating roller 16a in the lengthwise extension direction of the rotating roller, such as four planes 161a in FIG. 18, and the four planes 161a all intersect in the lengthwise extension direction of the rotating roller 16a. In a rotating process of the rotating roller 16a, four edges 1600 formed by longitudinal intersection of four planes 161a and two adjacent planes 161a make alternate contact with the edge 111 of the wafer 1, so as to apply the rotating force to the edge 111 of the semiconductor apparatus (such as the wafer 1 shown in FIG. 10, the wafer 1 being a subordinate concept of the semiconductor apparatus) inserted into the wafer cassettes 83-81 by means of the rotating roller 16a, such that the rotating roller 16a drives the plurality of wafers 1 inserted and accommodated in the wafer cassette 83 (or the wafer cassette 82 or the wafer cassette 81) and arranged in parallel to execute synchronous rotation in a horizontal rotation process. Moreover, a radial distance formed between the edge 1600 and the core shaft 164 is greater than that formed between the plane 161a and the core shaft 164, such that when the rotating roller 16a rotates in the lengthwise extension direction of the axis A and in the arrow B (or rotates in the direction opposite the arrow B), and the acting force in the vertical direction is applied to the wafer 1 in the vertical direction of the wafer 1, such that the wafer 1 is driven to vertically move periodically in the vertical direction (with reference to the direction shown by the double sided arrow K in FIG. 5), and a vibration effect of the rotating roller 16a on the wafer 1 is further improved. A contour shape of a cross section (i.e., perpendicular to a plane in which the axis A is located) of the rotating roller 16a includes a regular triangle, a square, a regular pentagon, a regular hexagon, etc.

Figure 3:
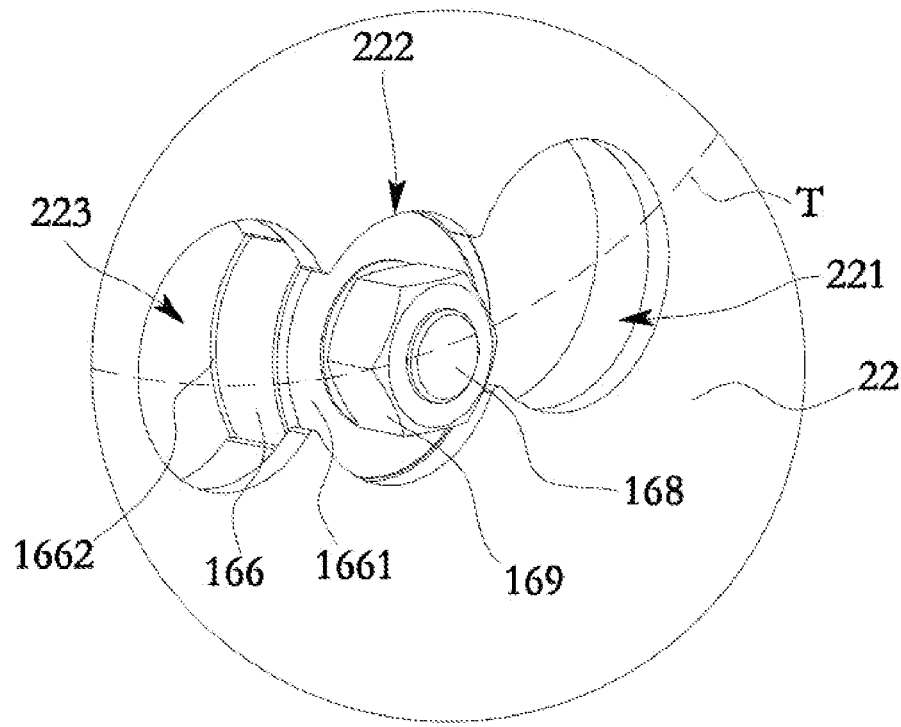
FIG. 3 is a partial enlarged view of a circle C in FIG. 2.
Figure 4:
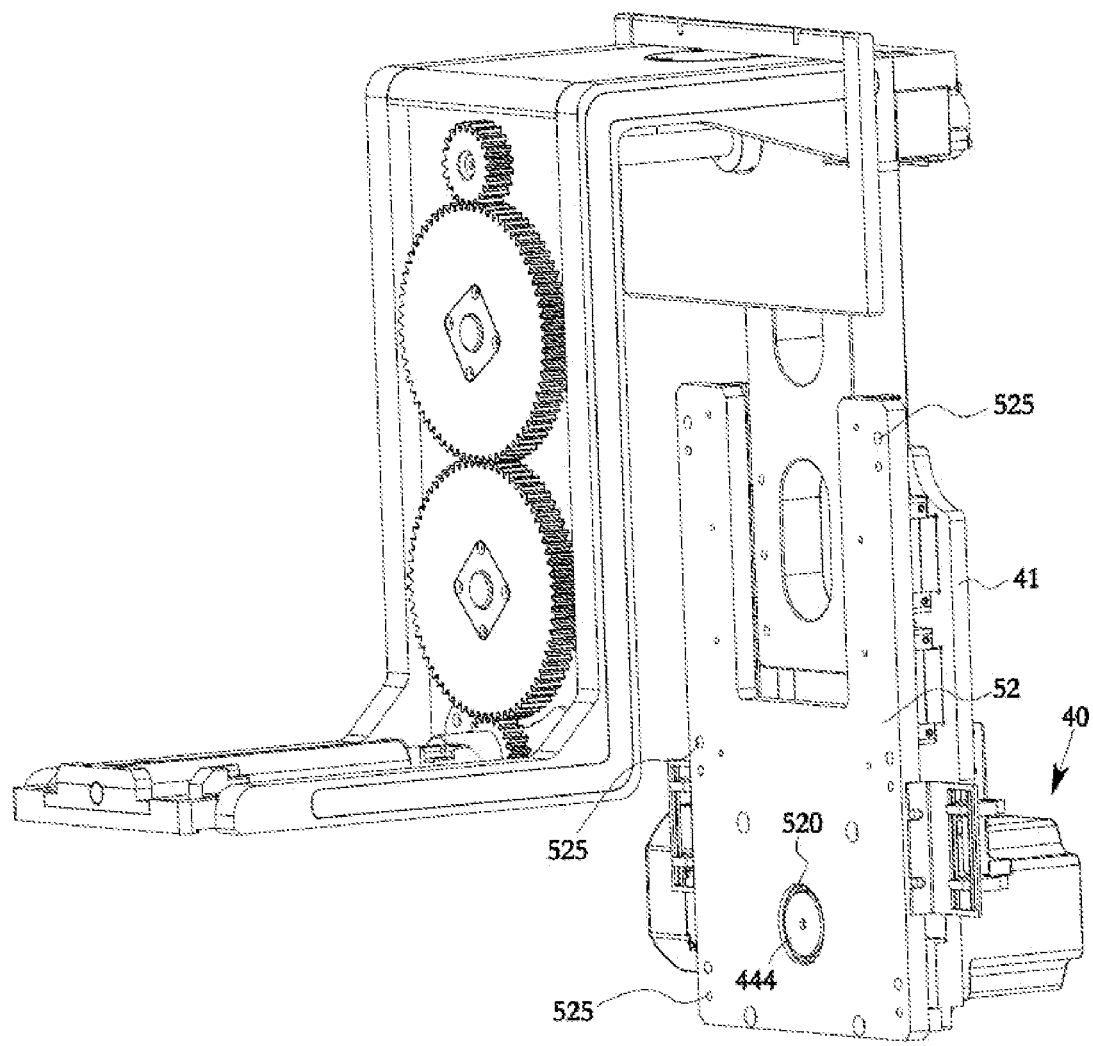
FIG. 4 is a solid diagram of a cover plate that is omitted in the bearing assembly for a semiconductor apparatus accommodating device.

With reference to FIGS. 2 and 3, a bottom of the connecting plate 22 is provided with a plurality of positioning stepped holes 221, positioning stepped holes 222 and positioning stepped holes 223 that are continuously provided, a tail end of the bearing plate 24 away from the connecting plate 22 is provided with a positioning seat for limiting longitudinal displacement of the rotating roller 16, an end of the rotating roller 16 close to the connecting plate 22 is provided with a first rolling member 166 embedded into the positioning stepped holes 222, the rotating roller 16 is longitudinally clamped by the positioning seat and the connecting plate 22, the positioning stepped holes 221-223 are provided in a cambered shape and are specifically provided in a direction shown by a dotted line T in FIG. 3 in a cambered shape, and two ends of the positioning stepped holes are upwarped. The positioning seat includes a positioning base 25 fixedly connected to the bearing plate 24 and a positioning cover plate 26 arranged above the positioning base 25 and used for clamping one end portion of the core shaft 164 of the rotating roller 16. As an optional implementation, the positioning base 25 and the positioning cover plate 26 may be transversely adjusted in a direction Q in FIG. 1 and fixedly connected to the bearing plate 24 by means of the positioning base 25. After the positioning base 25 and the positioning cover plate 26 are closed vertically, a through hole for accommodating the core shaft 164 is formed, and a bearing (not shown) for the core shaft 164 to penetrate in the direction of the axis A is arranged in the through hole, so as to ensure rotation smoothness of the core shaft 164.

Figure 14:
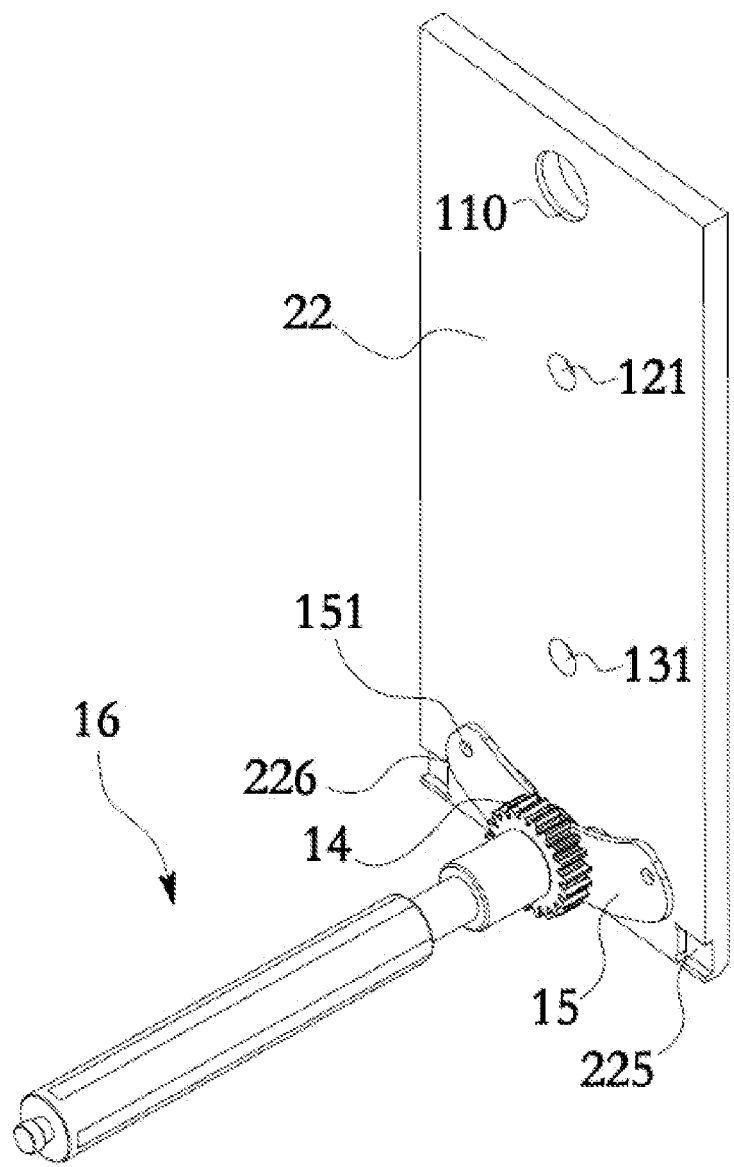
FIG. 14 only shows a solid diagram after a rotating roller is assembled to a connecting plate.

Preferably, in combination with FIGS. 1, 3 and 14, in this embodiment, the bearing assembly further includes a cambered fixing plate 15 that the rotating roller 16 vertically penetrates, where the cambered fixing plate 15 is connected to the connecting plate 22. Through holes 151 are provided at two ends of the cambered fixing plate 15, inner screw holes (not shown) matching the through holes 151 are provided on one surface of the connecting plate 22 making contact with the cambered fixing plate 15, and bolts penetrate the through holes 151 and are fixed to the inner screw holes, so as to reliably fix the rotating roller 16 and the coaxially-arranged driven gear 14 in the direction of the axis A. As shown in FIG. 14, rectangular and recessed abutting grooves 225 and 226 are further formed by two ends of a bottom of the connecting plate 22. In combination with FIG. 15, one side of the bearing plate 24 close to the connecting plate 22 protrudes to form abutting columns 244 which are inserted into and abut against the abutting grooves 225 and 226, such that after the bearing plate 24 and the connecting plate 22 are vertically assembled, and the bearing plate 24 and the connecting plate 22 are further clamped by means of bearing supports 23 on two sides, such that the bearing cantilever is more convenient to assemble, and the structure is firm and reliable.

In this embodiment, the rotating roller 16 may be adjusted in a cambered arrangement direction shown by a dotted line T, such that an end portion of the other end of the rotating roller 16 away from the positioning seat is embedded into the positioning stepped hole 221 or the positioning stepped hole 223. Even, the bearing assembly may be provided with three rotating rollers 16 or two rotating rollers 16 in a direction shown by the axis A. An end portion of the other end of the rotating roller 16 away from the positioning seat is embedded into the positioning stepped holes 221-223, so as to adjust the height of the rotating roller 16 in the vertical direction, such that it is ensured that the cambered surface 160 and/or the plane 161 (or ribs arranged annularly or spirally) having the circular cross section of the rotating roller 16 makes contact with the edge 111 of the wafer 1 all the time, so as to ensure that the wafer 1 may be reliably rotated in the process that the wafer cassette is integrally immersed into the cleaning tank 90 to execute cleaning or wet etching, and part of a side area 112 in which the wafer 1 makes contact with clamping grooves (i.e., clamping grooves 831-811 respectively shown in FIGS. 15-17) of the semiconductor apparatus accommodating device 80 is completely exposed, such that some of a side surface area 112 originally making contact with the clamping groove is throughly exposed conveniently, treatment effects of cleaning and wet etching of the semiconductor apparatus are improved, and the technical effect of better wet etching uniformity is indirectly obtained, so as to make the semiconductor apparatus have the technical advantage of better integral thinning uniformity when the semiconductor apparatus executes a thinning process on the basis of wet etching. Some of the above side area 112 may occur in some of an area within one or both side edges 111 of the wafer 1.

In combination with FIGS. 1, 2, 3 and 10, the rotating roller 16 includes an inner roller body 162, an elastic outer roller body 165 annularly arranged on an outer side of the inner roller body 162, a roller shaft base 163 annularly arranged in a protruding manner, and a core shaft 164 longitudinally penetrating the inner roller body 162 and the roller shaft base 163, where a positioning end 167 inserted into a driven gear 14 is formed by a tail end of the roller shaft base 163, the driven gear 14 is inserted into a positioning shaft 168 arranged coaxial with the core shaft 164, and the positioning shaft 168 vertically penetrates a cambered fixing plate 15 and is inserted into a first rolling member 166. After the positioning end 167 is inserted into a gear hole (not shown) provided on an end surface of the driven gear 14 in the direction of the axis A, the positioning shaft 168 is also inserted into the gear hole (not shown) of the driven gear 14 in the direction of the axis A. The positioning shaft 168 and the positioning end 167 are inserted into the gear hole of the driven gear 14 in the direction of the axis A and are assembled to an inner wall surface of the gear hole in an interference fit manner. The positioning shaft 168 vertically penetrates the cambered fixing plate 15 and is inserted into the first rolling member 166, and extends through a tail end of the first rolling member 166 in the direction of the axis A, to be in threaded connection with the bolt 169. A retainer ring 1662 and a retainer ring 1661 are arranged at two ends of the first rolling member 166 respectively, so as to prevent the first rolling member 166 from shifting in the direction of the axis A.

In combination with FIGS. 1, 2, 4 and 14, in this embodiment, the power transmission member includes a driving gear 11 driven by a first driving device 30, a driven gear 14 arranged an outer side of a roller shaft base 163 in a sleeving manner, and two carrier gears meshing with the driving gear 11 and the driven gear 14, i.e., a carrier gear 12 and a carrier gear 13 which mesh with each other and transmit power, where the carrier gear 12 and the carrier gear 13 are fixed on the connecting plate 22. The carrier gear 12 is provided with a rotating shaft 120 in a direction perpendicular to the connecting plate 22, and the carrier gear 13 is provided with a rotating shaft 130 in a direction perpendicular to the connecting plate 22. The rotating shaft 120 horizontally extends through the through hole 121 provided on the connecting plate 22, and the rotating shaft 130 horizontally extends through the through hole 131 provided on the connecting plate 22. A through hole 110 for allowing the rotating shaft of the driving gear 11 to penetrate is provided at a top of the connecting plate 22. The rotating shaft 120 is located on a back surface of the connecting plate 22 to be in threaded connection with the bolt 227, and the rotating shaft 130 is located on the back surface of the connecting plate 22 to be in threaded connection with the bolt 228. A bearing (not shown) is arranged in each of the through hole 110, the through hole 121, and the through hole 131. The rotating shaft 120 penetrates the bearing arranged in the through hole 121, and the rotating shaft 130 penetrates the bearing arranged in the through hole 131, such that the rotating shafts, such as the rotating shaft 120 and the rotating shaft 130, connected to the carrier gear may flexibly and horizontally rotate in a posture perpendicular to the connecting plate 22.

As a reasonable variation of the above power transmission member, the power transmission member includes a driving gear 11 driven by a first driving device 30, a driven gear 14 arranged an outer side of a roller shaft base 163 in a sleeving manner, and a synchronous belt meshing with the driving gear 11 and the driven gear 14. In this case, the two carrier gears in FIG. 1 may be replaced with one synchronous belt (not shown), so as to transmit a driving force to drive the rotating roller 16 to the driven gear 14 by means of the synchronous belt, so as to finally drive the rotating roller 16 (or the rotating roller 16a) to apply a rotating force to the edge 111 of the wafer 1 in a state of always attaching to the edge 111 of the wafer 1, so as to drive the wafer 1 to rotate in the semiconductor apparatus accommodating device 80 or rotate and vibrate at the same time.

In combination with FIGS. 1, 2, 5 and 7, the connecting plate 22 and the supporting assembly are vertically arranged and separated in parallel. The first driving device 30 is fixed to the top of the supporting assembly, and a driving shaft 33 arranged horizontally, extending through the connecting plate 22 and driving the driving gear 11 is formed by the first driving device 30. The supporting assembly in this embodiment includes a device for connecting and integrally supporting the bearing cantilever. The supporting assembly includes a vertical abutting plate 60 and a back plate 41. Of course, from another aspect, the middle plate 52 and the cover plate 51 may also be regarded as part of the supporting assembly. The function of the bearing assembly in the embodiment may be generalized as fixing the first driving device 30 and connecting the bearing assembly. The connecting plate 22 and the supporting assembly are vertically arranged and separated in parallel, such that the bearing assembly, particularly the whole and most of the connecting plate 22 of the bearing portion, may be submerged in the cleaning solution contained in the cleaning tank 90, and it is ensured that the wafer cassette clamped on the bearing portion may be integrally submerged in the cleaning solution contained in the cleaning tank 90. The specific type of the cleaning solution may be adaptively selected according to specific requirements of the wet etching or cleaning process.

Specifically, the bearing assembly further includes: a cover plate 51 and a back plate 41 that are separated in parallel and are slidably connected, a vertical abutting plate 60 vertically inserted between the cover plate 51 and the back plate 41 and fixedly connected with the back plate 41, and a vibration mechanism 4. The vibration mechanism 4 integrally drives the back plate 41 and the vertical abutting plate 60 to vertically reciprocate relative to the cover plate 51, so as to integrally drive the bearing cantilever to vertically reciprocate. On the basis of the vertical reciprocating motion, the bearing cantilever does periodic vertical reciprocating motion on the wafer 1 inserted into the wafer cassette born by the bearing cantilever in the cleaning solution, so as to achieve a vibration effect of the wafer 1 in the cleaning or wet etching process, so as to separate chemical glue or particles bonded to circular surfaces of two sides of the wafer 1 and the edge 111 formed in a thickness direction of the wafer 1 from the wafer 1 by means of vibration under the joint cooperation of the cleaning solution. The cleaning solution may be a buffered oxide etching solution, an SPM solution, an SC-1 solution, an SC-2 solution, an aluminum etching agent, a phosphoric acid etching solution or deionized water.

With reference to FIGS. 8-9 and 11-13, in this embodiment, the vibration mechanism 4 includes: a second driving device 40, a driving rotary disc 44, a driving shaft 49 eccentrically penetrating the driving rotary disc 44, a second rolling member 471 making rolling contact along an annular surface 440 of the driving rotary disc 44, and a driving plate 46 fixedly connected to the back plate 41. The driving rotary disc 44 is in a shape of circular disc, and the driving shaft 49 deviates from a circle center of the driving rotary disc 44 and vertically penetrates the driving rotary disc 44. A central axis F of the driven shaft 45 is always located above a central axis G of the driving shaft 49, and the central axis G does not coincide with a central axis H formed by the driving rotary disc 44. The central axis F, the central axis G and the central axis H are always kept parallel.

Figure 8:
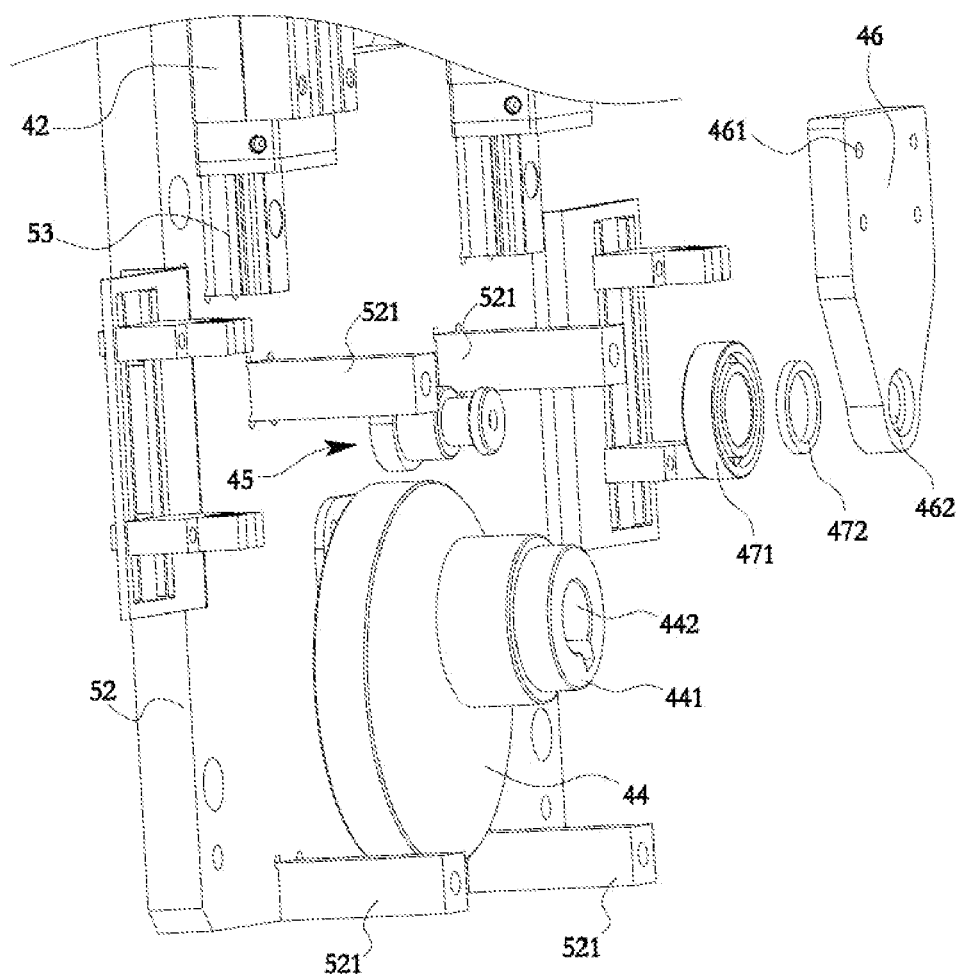
FIG. 8 is an exploded view of a middle plate arranged parallel to a cover plate and a back plate.

The second rolling member 471 is provided with the driven shaft 45 inserted into a pin hole 462 formed at a bottom of a driving plate 46. One end of the driving shaft 49 vertically penetrates the middle plate 52, the other end of the driving shaft 49 is driven by the second driving device 40, and the driven shaft 45 is separated from the middle plate 52. With reference to FIGS. 2 and 8, one side of the middle plate 52 facing the vibration mechanism 4 is provided with four stand columns 521 arranged around the driving rotary disc 44. The second driving device 40 includes a second electric motor 400, a reversing device 401 and an electric motor mounting plate 402, where a core shaft 403 perpendicular to the electric motor mounting plate 402 is arranged in the reversing device 401, and the core shaft 403 is inserted into a pin hole 442 and clamps the driving shaft 49 by means of the second driving device 40 and the middle plate 52. The electric motor mounting plate 402 may be square and is fixedly connected to the middle plate 52 by means of four stand columns 521. The second electric motor 400 (as well as the first driving device 30) may be a servo motor or a stepping motor and is connected to a control system by means of a wire. Two bevel gears (not shown) meshing with each other are arranged in the reversing device 401, to convert a power output direction and finally transmit power to the core shaft 403, so as to drive the driving rotary disc 44 to rotate around the central axis G of the driving shaft 49 shown in FIG. 11 by means of the core shaft 403.

Figure 11:
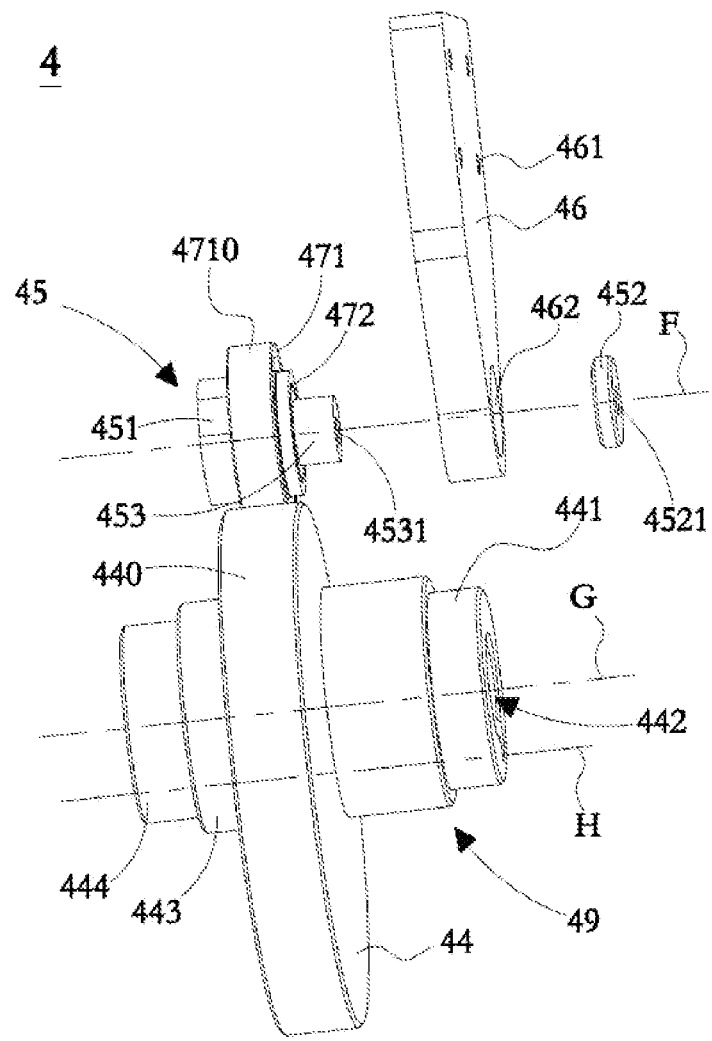
FIG. 11 is an exploded view of a vibration mechanism.
Figure 12:
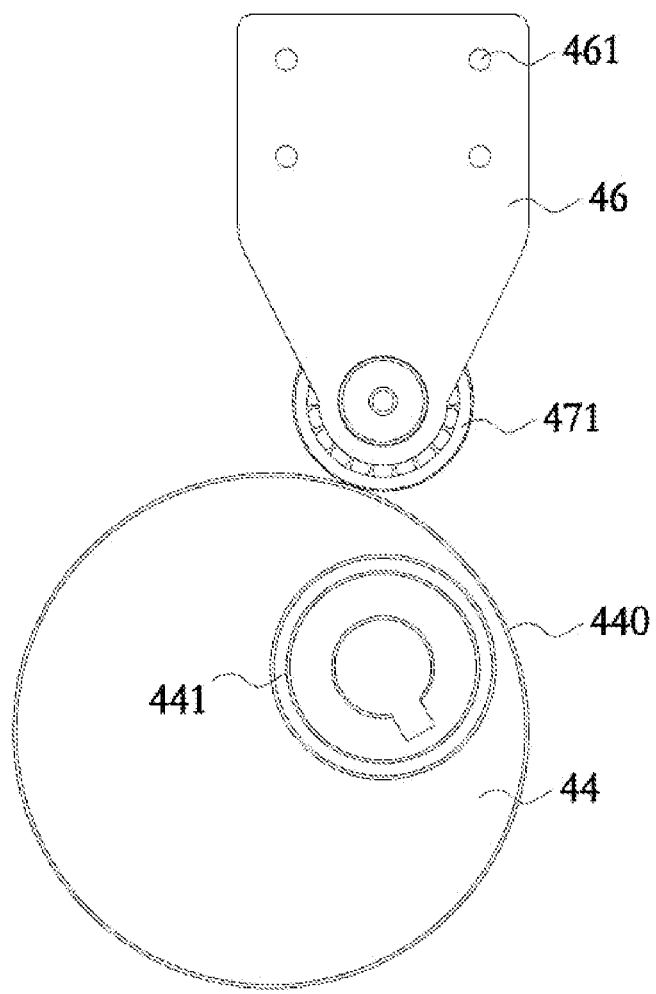
FIG. 12 is a front view of the vibration mechanism in FIG. 11 after assembly in an angle of view.
Figure 13:
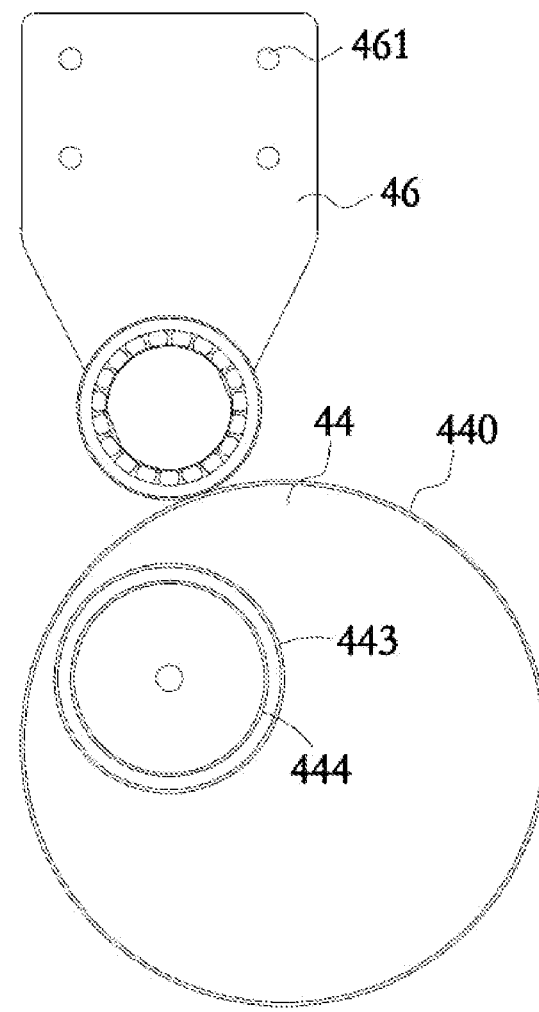
FIG. 13 is a front view of the vibration mechanism in FIG. 11 after assembly in another angle of view.

In combination with FIGS. 11-13, in this embodiment, the driven shaft 45 includes: a base 451. The second rolling member 471 being embedded into a shaft portion of the base 451 extending from the middle plate 52 to the back plate 41; a retainer ring 472 arranged on the base in a sleeving manner 451 and stopping the second rolling member 471 from stripping; a rotating shaft 453 extending from the base 451, gradually shrunk and arranged in the pin hole 462; a limiting ring 452 embedded into the pin hole 462 and having a through hole 4521; and a fastener (such as a bolt). The fastener continuously penetrates the limiting ring 452 and the pin hole 462 along the central axis F and is screwed into a blind hole 4531 that is provided at an end surface of the rotating shaft 453 and is provided with an internal thread, so as to rotatably connect the driven shaft 45 to the driving plate 46. An annular surface 4710 of the second rolling member 471 makes contact with the annular surface 440 of the driving rotary disc 44 all the time, and the second rolling member 471 and the driving rotary disc 44 coincide with each other in the vertical direction. When the driving rotary disc 44 is driven anticlockwise in FIG. 12, the second electric motor 400 drives the driving rotary disc 44 to rotate in a direction perpendicular to a paper surface, thereby driving the driving plate 46 and the back plate 41 to move downwards in the vertical direction; and when the driving rotary disc 44 is driven clockwise in FIG. 12, the second electric motor 400 drives the driving rotary disc 44 to rotate in a direction perpendicular to the paper surface, thereby driving the driving plate 46 and the back plate 41 to move upwards in the vertical direction. Finally, the driving plate 46 drives the back plate 41, the back plate 41 drives the vertical abutting plate 60, to vertically reciprocate in a direction V in FIG. 1, and the vertical abutting plate 60 drives the bearing cantilever, to vertically reciprocate in the direction V in FIG. 1, such that a vibration effect on the wafer 1 accommodated in the semiconductor apparatus accommodating device 80 is achieved.

In combination with FIGS. 1, 2 and 6, a first cambered notch 211 is formed by the substrate 21, the top of the vertical abutting plate 60 is provided with an abutting plate 62, a second cambered notch 621 is formed by the abutting plate 62, an opening portion is delimited by the first arc-shaped notch 211 and the second arc-shaped notch 621, and a waist-shaped plate 63 is arranged at the opening portion, to connect the substrate 21 and the abutting plate 62 by means of the waist-shaped plate 63. The waist-shaped plate 63 may not only connect the substrate 21 and the abutting plate 62, but also serves as a manhole for mounting and servicing a coupling 32, so as to facilitate later maintenance. The abutting plate 62 is provided with a through hole 622 and a bolt is used to vertically penetrate the through hole 622 and is in threaded connection with a transverse expansion portion 61 formed at the top of the vertical abutting plate 60. The top of the vertical abutting plate 60 is provided with a rectangular through hole 601 for the first driving device 30 to horizontally penetrate same and provide a fixing function.

Figure 7:
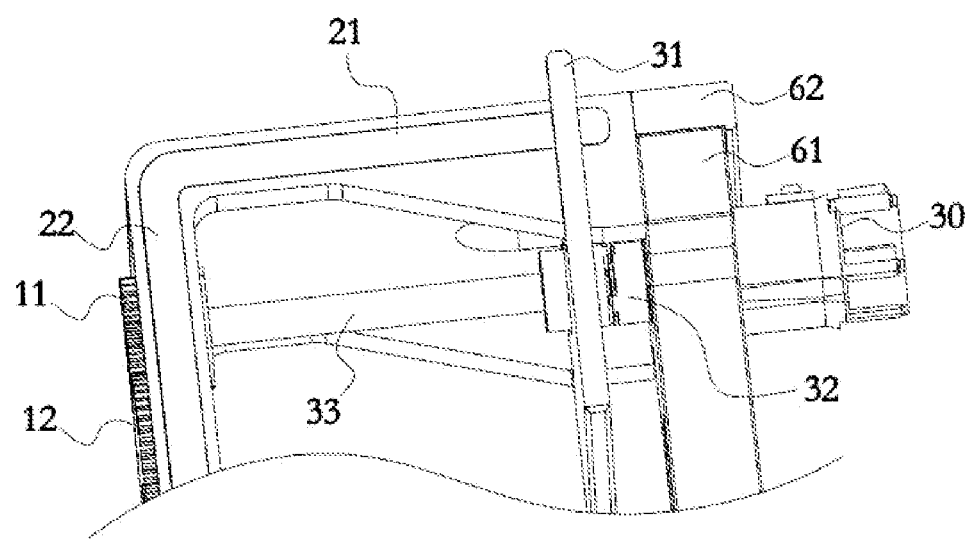
FIG. 7 is a top partial solid diagram of a bearing assembly for a semiconductor apparatus accommodating device.

In combination with FIG. 7, the first driving device 30 is connected to the driving shaft 33 by means of a coupling 32, and the driving shaft 33 is arranged coaxial with the driving gear 11, so as to drive the driving gear 11 to rotate by means of the first driving device 30. It should be noted that as a reasonable variation in this embodiment, the driving device 30, the coupling 32, and the driving shaft 33 may further be arranged above the horizontally-arranged substrate 21. Tri-angular reinforcing plates 213 are arranged on two sides of a lower portion of the substrate 21, a through hole 611 is provided on the transverse expansion portion 61, and then a bolt is used to horizontally penetrate the through hole 611 and is in threaded connection with and fixed to the blind hole (not shown) provided on a joint surface of the reinforcing plates 213 and the transverse expansion portion 61 and having an internal thread, such that reliability of vertical assembly of the substrate 21 and the vertical abutting plate 60 is further improved.

Figure 5:
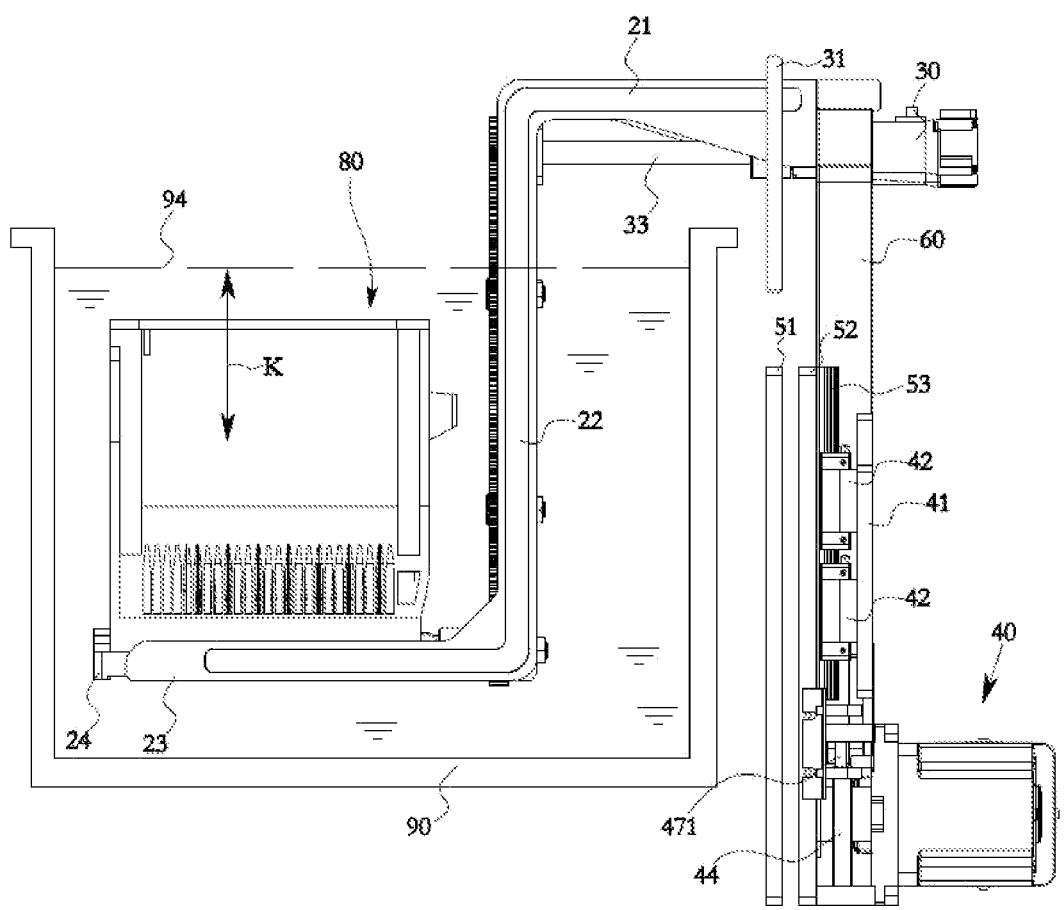
FIG. 5 is a side view when a bearing assembly for a semiconductor apparatus accommodating device shown in FIG. 1 bears a wafer cassette (which is a subordinate concept of the semiconductor apparatus accommodating device) for accommodating a wafer and places the wafer cassette in a cleaning tank, to execute wet etching or cleaning.
Figure 6:
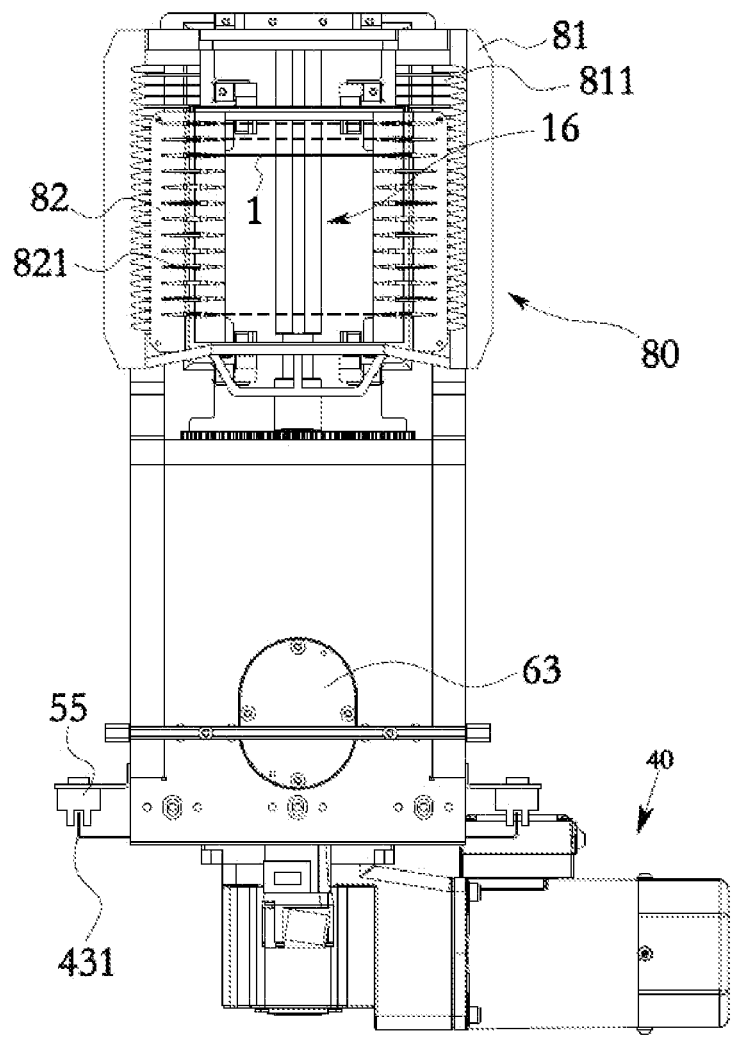
FIG. 6 is a top view of the bearing assembly for a semiconductor apparatus accommodating device shown in FIG. 5 that bears the wafer cassette for accommodating the wafer.

In combination with FIG. 5, as a preferred solution, the bearing assembly further includes a protective plate 31 arranged vertically and used for blocking a cleaning solution from eroding the first driving device 30. Generally, the cleaning solution used in a wet etching process has high corrosivity. Therefore, the protective plate 31 is arranged, such that corrosion of the first driving device 30 caused by the cleaning solution which may be splashed at a position close to the opening at the top of the cleaning tank 90 is avoided, and service life of the bearing assembly is prolonged.

With reference to FIGS. 2, 5, and 11-13, in this embodiment, several sliders 42 are symmetrically arranged on one side of the back plate 41 facing the cover plate 51, a middle plate 52 fixedly connected to the cover plate 51 is clamped between the cover plate 51 and the back plate 41, and a guide rail 53 slidably connected to the sliders 42 is arranged on the middle plate 52 in a vertical direction. A first-stage step 443 and a second-stage step 444 that are gradually shrunk are formed at one end of the driving shaft 49, the second-stage step 444 is embedded into a limiting hole 520 formed in the middle plate 52, a cylinder 441 is formed at the other end of the driving shaft 49, and a pin hole 442 for insertion of a power output shaft formed by the second driving device 40 is formed in a circle center of the cylinder 441.

Figure 9:
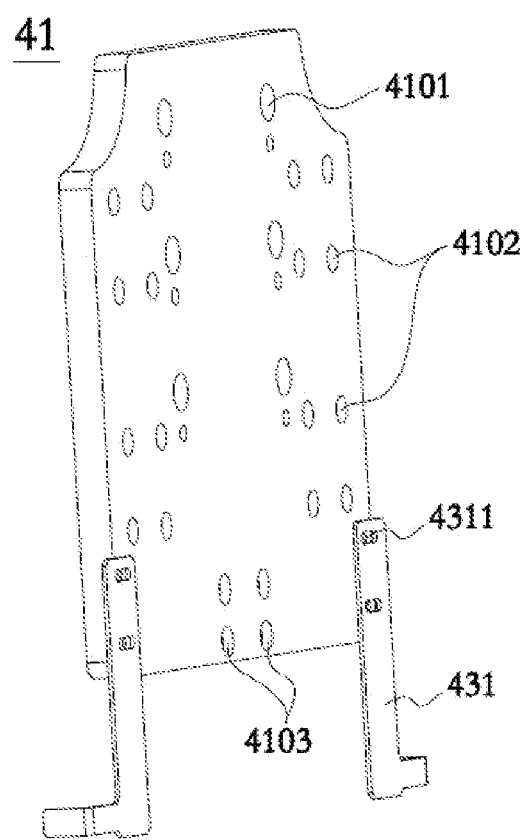
FIG. 9 is a solid diagram of the back plate assembled parallel to the middle plate shown in FIG. 8.

With reference to FIGS. 2, 8 and 9, in this embodiment, a lower limit position sensor 55 and an upper limit position sensor 56 are arranged at a side portion of a bottom of the middle plate 52, and a blocking piece 431 is arranged at the bottom of the back plate 41. The blocking piece 431 is fixedly connected to the back plate 41 by means of a blocking piece substrate 43 and a bolt 4311. The second driving device 40 drives the driving rotary disc 44 to periodically rotate around the driving shaft 49, so as to drive the second rolling member 471 to roll along the annular surface 440 of the driving rotary disc 44 by means of the driving rotary disc 44, so as to drive the back plate 41 to vertically reciprocate by means of the driven shaft 45 and the driving plate 46, so as to integrally drive the bearing cantilever to vertically reciprocate. The lower limit position sensor 55 and the upper limit position sensor 56 are movably embedded in an adjusting support 54 arranged on the side portion of the bottom of the middle plate 52, the adjusting support 54 is provided with a strip-shaped opening 541 for allowing the lower limit position sensor 55 and the upper limit position sensor 56 to vertically slide in the vertical direction, and a distance formed between the lower limit position sensor 55 and the upper limit position sensor 56 in the vertical direction is adjusted, so as to determine and adjust a vibration amplitude of vertical reciprocating motion of the bearing cantilever, such that the vibration amplitude of vertical vibration of the wafer cassette in the cleaning tank 90 is freely adjusted.

As shown in FIG. 9, several through holes 4101 are provided on the back plate 41, and bolts are used to penetrate the through holes 4101 and are vertically assembled to blind holes correspondingly provided on the surface of the vertical abutting plate 60 and having internal threads, so as to fixedly connect the back plate 41 and the vertical abutting plate 60. The back plate 41 is further provided with several through holes 4102, and bolts are used to penetrate the through holes 4102 and are in threaded connection with and fixed to the sliders 42. Four through holes 4104 are further provided at the bottom of the back plate 41, and bolts are used to penetrate the through holes 4103 and are in threaded connection and fixed to four blind holes 461 provided on the driving plate 46 in FIG. 8 and having internal threads. In the process that the vibration mechanism integrally drives the back plate 41 and the vertical abutting plate 60 to vertically reciprocate relative to the cover plate 51 and the middle plate 52, the driving plate 46 is in rigid connection with the back plate 41, the back plate 41 achieves vertical reciprocating motion of the back plate 41 and the vertical abutting plate 60 in the direction V in FIG. 1 by means of two sets of sliders and guide rails that which are slidably connected to each other, and in a process of vertical reciprocating motion of the back plate 41 and the vertical abutting plate 60, the middle plate 52 remains stationary with the cover plate 51.

Moreover, the lower limit position sensor 55 and the upper limit position sensor 56 are each connected to a control system (such as a programmable logic controller (PLC)) by means of a wire, and the control system periodically sends forward and reverse rotation driving signals to the second electric motor 400. A bent portion is formed by the blocking piece 431 towards a direction of the middle plate 52, and when the bent portion moves to the lower limit position sensor 55 or the upper limit position sensor 56 in the vertical direction, a position signal that the back plate 41 has reached a lower limit position or an upper limit position is sent to the control system.

In combination with FIGS. 11-13, when the control system receives the position signal that the back plate 41 has reached the upper limit position, the driving rotary disc 44 in FIG. 12 is driven by the second electric motor 400 in an anticlockwise direction to drive the driving rotary disc 44 to rotate in a direction perpendicular to the paper surface, thereby driving the driving plate 46 and the back plate 41 to move downwards in the vertical direction; and when the control system receives the position signal that the back plate 41 has reached the lower limit position, the driving rotary disc 44 is driven by the second electric motor 400 in a clockwise direction of the driving rotary disc 44 in FIG. 12 to rotate in a direction perpendicular to the paper surface, thereby driving the driving plate 46 and the back plate 41 to move upwards in the vertical direction. Thus, the vibration amplitude (i.e., a vibration stroke) formed by the bearing cantilever between the upper limit position and the lower limit position in the vertical direction is achieved, and the vibration amplitude may be flexibly adjusted by adjusting a distance between the lower limit position sensor 55 and the upper limit position sensor 56 in the vertical direction, so as to adjust the variation amplitude of the bearing cantilever in the cleaning tank 90.

With reference to FIGS. 1, 2 and 15-17, in this embodiment, an upper surface of the bearing plate 24 is provided with four first positioning members 27 and four second positioning members 28 arranged at an outer side of the first positioning member 27, and the bearing plate 24 is provided with a positioning groove 242 recessed at an outer side of the second positioning member 28.

With reference to FIG. 15, the top of the wafer cassette 83 has an opening for the wafer 1 to be inserted into the clamping groove 831 in a vertical posture, and the wafer cassette 83 is inserted into a plurality of four-inch wafers. Two sides of the bearing plate 24 in the extension direction of the axis A are each provided with a positioning groove 242 in a recessed manner. Positioning ribs 830 clamped to the four first positioning members 27 are arranged at the bottom of the wafer cassette 83 in the vertical direction perpendicular to the plane in which the wafer is located. A right-angle flange 272 expanding outwards and a first positioning surface 271 lower than the right-angle flange 272 are formed by a first positioning member 27, so as to clamp the positioning ribs 830 by means of the first positioning surface 271 and the right-angle flange 272. The four first positioning members 27 are arranged above the bearing plate 24 in a rectangular shape. The four second positioning members 28 are also arranged above the bearing plate 24 and on an outer side of the first positioning member 27 in a rectangular shape. A right-angled flange 281 retracting inwards and a second positioning surface 282 lower that the right-angled flange 281 are formed by the second positioning member 28. The bearing plate 24 is recessed downwards in a direction P, to form a positioning groove 242, and the positioning groove 242 is located on an outer side of a direction Q, to form an inner side wall surface 241. A strip-shaped side wall formed by the outer side of the right-angle flange 281 in the direction Q and the inner side wall surface 241 jointly define two positioning grooves 242 recessed in the bearing plate 24 and provided in parallel. The wafer cassette 83 is inserted into the bearing plate 24 in a direction indicated by an arrow P, and end portions of two ends of the two positioning ribs 830 are clamped into the right-angled flange 272 respectively and make contact with the first positioning surface 271.

With reference to FIG. 16, the top of the wafer cassette 82 has an opening for the wafer 1 to be inserted into the clamping groove 821 in a vertical posture, and the wafer cassette 82 is inserted into a plurality of six-inch wafers. The bottom of the wafer cassette 82 in the vertical direction perpendicular to the plane in which the wafer is located is provided with a positioning rib 820 clamped into the second positioning member 28. The wafer cassette 82 is inserted into the bearing plate 24 in the direction indicated by an arrow P, and end portions of two ends of the two positioning ribs 820 are clamped into the right-angled flanges 281 and make contact with the second positioning surfaces 282 respectively.

With reference to FIG. 17, the top of the wafer cassette 81 is provided with an opening for the wafer 1 to be vertically inserted into the clamping groove 821, and a plurality of eight-inch wafers are inserted into the wafer cassette 81. A positioning rib 810 clamped into the positioning groove 242 is arranged at the bottom of the wafer cassette 81 in the vertical direction perpendicular to the plane in which the wafer is located.

According to the bearing assembly for a semiconductor apparatus accommodating device disclosed in this embodiment, the rotating force is applied by means of the rotating roller 16, to the edge of the semiconductor apparatus inserted into the semiconductor apparatus accommodating device 80, so as to make the semiconductor apparatus rotate in the clamping groove of the semiconductor apparatus accommodating device 80, such that it is ensured that in a semiconductor manufacturing process of executing wet etching or cleaning on the semiconductor apparatus, part of an area in which the semiconductor apparatus makes contact with the clamping groove of the semiconductor apparatus accommodating device 80 may be completely exposed, and the technical problem that chemical glue and particles may not be effectively removed from the edge in which the semiconductor apparatus makes contact with the inner wall surface of the clamping groove is effectively solved, such that a treatment effect of cleaning and wet etching on the semiconductor apparatus is improved, and the technical effect that uniformity of wet etching is better is indirectly obtained, so as to make integral thinning uniformity better when the semiconductor apparatus executes a thinning process on the basis of wet etching.

The vibration mechanism integrally drives the back plate 41 and the vertical abutting plate 60 to vertically reciprocate relative to the cover plate 51, so as to integrally drive the bearing cantilever, to vertically reciprocate, such that the semiconductor apparatus does vertical reciprocating motion on the basis of the bearing cantilever in the process of executing wet etching or cleaning, so as to drive the semiconductor apparatus accommodating device 80 born by the bearing plate 24 to vertically reciprocate, and the semiconductor apparatus clamped in the semiconductor apparatus accommodating device 80 vertically vibrates, such that chemical glue and particles attached to a surface of the semiconductor apparatus are vibrated off favorably, and the effects of semiconductor manufacturing processes such as wet etching and cleaning of the semiconductor apparatus are improved.

The bearing assembly for a semiconductor apparatus accommodating device does not need to depend on a cleaning tank for mounting an ultrasonic or megasonic generator, such that the situation that damage is caused to a microscopic device formed in the semiconductor apparatus by using ultrasonic waves or megasonic waves in the cleaning or wet etching process is effectively avoided, and the undesirable phenomenon that a metal film is stripped from a substrate is avoided.

Embodiment 2

Figure 19:
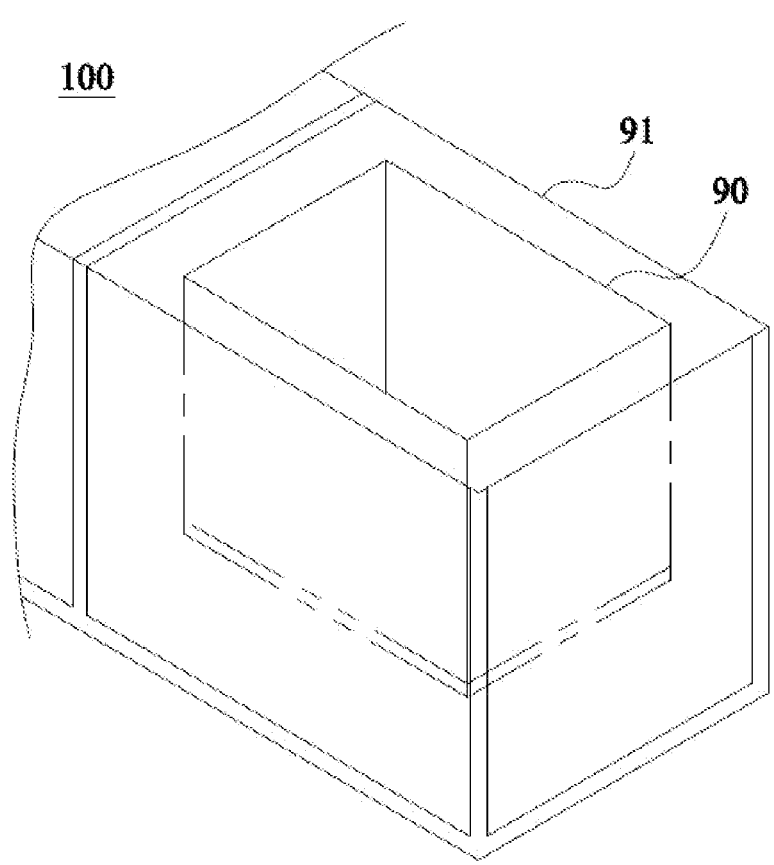
FIG. 19 is a partial solid diagram of a semiconductor apparatus cleaning device of the present disclosure.

In cooperation with FIG. 19, on the basis of the technical solution of the bearing assembly for a semiconductor apparatus accommodating device disclosed in Embodiment 1, this embodiment further discloses a semiconductor apparatus cleaning device 100.

The semiconductor apparatus cleaning device 100 includes: several cleaning tanks 90 forming accommodating cavities, housings 91 enclosing the cleaning tanks, and several bearing assemblies for semiconductor apparatus accommodating devices of Embodiment I fixedly connected to the housings 91. A bearing cantilever in the bearing assembly extends into the accommodating cavity of the cleaning tank 90. Actual wall thicknesses of both the cleaning tank 90 and the housing 91 in FIG. 19 are neglected, and in combination with FIG. 4, screw holes 525 are provided in four corners and in a middle of the middle plate 52, and blind holes (not shown) having internal threads are also provided in one side of the cover plate 51 facing the middle plate 52 and located opposite the screw holes 525.

In actual mounting, the bolt (not shown) may horizontally and continuously penetrates the side wall of the housing 91 and extends through the screw hole 525, so as to finally reliably connect the blind hole provided in the cover plate 51 and having internal threads, such that the cover plate 51 and the middle plate 52 may be fixed to the housing 91. In this case, the back plate 41 may be driven by the second driving device 40 to drive the back plate 41 to vertically reciprocate in the direction V in FIG. 1, such that the vertical abutting plate 60 is driven by the back plate 41 to vertically reciprocate relative to the cover plate 51, so as to integrally drive the bearing cantilever to vertically reciprocate, such as to execute vibration cleaning wafers on the wafer cassettes 83-81 (which is a subordinate concept of the semiconductor apparatus accommodating device 80) born by the bearing assembly for a semiconductor apparatus accommodating device 80 in the cleaning solution accommodated in the accommodating cavity (such as a cube) of the cleaning tank 90. A liquid level 94 formed by the cleaning solution is always higher than the semiconductor apparatus accommodating device 80 in a cleaning or wet etching process. The semiconductor apparatus accommodating device 80 reciprocates in the cleaning tank 90 in the direction indicated by the double-sided arrow K to generate a vibration effect on a plurality of wafers 1 inserted into the semiconductor apparatus accommodating device 80.

the rotating force is applied by means of one or more rotating rollers 16 (or a rotating roller 16a), to the edge of the semiconductor apparatus inserted into the semiconductor apparatus accommodating device (i.e., wafer cassettes 83-81), so as to drive the wafer to rotate and/or vibrate in the clamping grooves 831-811 of the wafer cassette, such that part of a cambered edge area in which the wafer makes contact with the clamping grooves 831-811 may be completely exposed, a more thorough cleaning or wet etching effect on semiconductor devices such as wafers is achieved, and the technical effect of better wet etching uniformity is indirectly achieved.

The semiconductor apparatus cleaning device 100 may include a plurality of cleaning tanks 90 arranged linearly, where a semiconductor apparatus accommodating device 80 (such as the wafer cassettes 83-81) may be transferred between cleaning tanks 90 that execute different cleaning processes or different wet etching processes by a mechanical arm that does horizontal motion and lifting motion and is used for grabbing the wafer cassettes above the housing 91.

The semiconductor apparatus cleaning device 100 disclosed in this embodiment has the same technical solution as Embodiment 1, which refers to Embodiment 1, which will not be repeated herein.

A series of detailed descriptions listed above are only specific descriptions of feasible implementations of the present disclosure, and are not intended to limit the scope of protection of the present disclosure. Equivalent implementations or changes made without deviating from the technical spirit of the present disclosure should fall within the scope of protection of the present disclosure.

For those skilled in the art, it is apparent that the present disclosure is not limited to the details of the above-mentioned exemplary embodiments, and the present disclosure may be implemented in other specific forms without departing from the spirit or basic features of the present disclosure. Therefore, no matter from which point of view, the embodiments should all be regarded as exemplary and non-limiting. The scope of the present disclosure is defined by the appended claims rather than the above-mentioned description, and therefore it is intended that all changes which fall within the meaning and scope of equivalency of the claims are embraced in the present disclosure. Any reference numeral in the claims should not be construed as limiting the related claims.

In addition, it should be understood that although the description is described according to implementations, not every implementation only includes one independent technical solution. This description is only for the sake of clarity. Those skilled in the art should take the description as a whole, and the technical solutions in each embodiment may also be properly combined to form other implementations that may be understood by those skilled in the art.

What is claimed is:

1. A bearing assembly for a semiconductor apparatus containment device, used for bearing the semiconductor apparatus containment device, and comprising: a bearing cantilever, a supporting assembly connected to the bearing cantilever and a first drive device, wherein the bearing cantilever comprises: a bearing portion for bearing the semiconductor apparatus containment device, a connecting plate and a substrate, the bearing portion being composed of a bearing plate and a bearing support, the bearing plate is horizontally inserted into the bearing support, an opening for exposing a semiconductor apparatus being formed at a bottom of the semiconductor apparatus containment device, the bearing plate being provided with a rotatable rotating roller located below the opening, the rotating roller making contact with an edge of the semiconductor apparatus, and the first drive device driving the rotating roller to rotate by means of a power transmission member, so as to apply a rotating force by means of the rotating roller, to an edge of the semiconductor apparatus inserted into the semiconductor apparatus containment device; and a bottom of the connecting plate is provided with several positioning stepped holes continuously provided, a positioning seat for limiting longitudinal displacement of the rotating roller is arranged at a tail end of the bearing plate away from the connecting plate, a first rolling member embedded into the positioning stepped holes is arranged at an end of the rotating roller close to the connecting plate, the rotating roller is longitudinally clamped by the positioning seat and the connecting plate, and the positioning stepped holes are distributed in an arc shape.

2. The bearing assembly according to claim 1, wherein a cambered surface is formed by the rotating roller in a lengthwise extension direction of the rotating roller, so as to apply a rotating force by means of the cambered surface, to the edge of the semiconductor apparatus inserted into the semiconductor apparatus containment device.

3. The bearing assembly according to claim 2, wherein at least one plane is formed by the cambered surface formed by the rotating roller in the lengthwise extension direction of the rotating roller, so as to apply a rotating force by means of the cambered surface and the plane, to the edge of the semiconductor apparatus inserted into the semiconductor apparatus containment device, and the cambered surface and the plane make alternate contact with the edge of the semiconductor apparatus in a rotating process of the rotating roller, so as to drive the semiconductor apparatus to vertically move periodically.

4. The bearing assembly according to claim 1, wherein a plurality of planes are formed by the rotating roller in a lengthwise extension direction of the rotating roller, and make alternate contact with the edge of the semiconductor apparatus in a rotating process of the rotating roller, so as to drive the semiconductor apparatus to vertically move periodically.

5. The bearing assembly according to claim 1, further comprising a cambered fixing plate, the rotating roller vertically penetrates into the cambered fixing plate, wherein the cambered fixing plate is connected to the connecting plate.

6. The bearing assembly according to claim 5, wherein the rotating roller comprises an inner roller body, an elastic outer roller body annularly arranged on an outer side of the inner roller body, a roller shaft base annularly arranged in a protruding manner, and a core shaft longitudinally penetrating the inner roller body and the roller shaft base;
the power transmission member comprises a driving gear driven by the first drive device, a driven gear arranged on an outer side of the roller shaft base in a sleeving manner and at least one carrier gear meshing with the driving gear and the driven gear, the carrier gear being fixed to the connecting plate; and
a positioning end inserted into the driven gear is formed by a tail end of the roller shaft base, the driven gear is plugged into a positioning shaft coaxially arranged with the core shaft.

7. The bearing assembly according to claim 6, wherein the power transmission member comprises a driving gear driven by the first drive device, a driven gear arranged on the outer side of the roller shaft base in a sleeving manner, and a synchronous belt meshing with a driving gear and a driven gear.

8. The bearing assembly according to claim 1, wherein the connecting plate and the supporting assembly are vertically arranged and separated in parallel.

9. The bearing assembly according to claim 6, wherein the first drive device is fixed to a top of the supporting assembly, and a driving shaft arranged horizontally, extending through the connecting plate and driving the driving gear is formed by the first drive device.

10. The bearing assembly according to claim 1, further comprising: a cover plate and a back plate that are separated in parallel and are slidably connected to each other, a vertical abutting plate vertically inserted between the cover plate and the back plate and fixedly connected to the back plate, and an oscillatory device, wherein
the oscillatory device integrally drives the back plate and the vertical abutting plate to vertically reciprocate relative to the cover plate, so as to integrally drive the bearing cantilever to vertically reciprocate.

11. The bearing assembly according to claim 10, wherein a first cambered notch is formed by the substrate, an abutting plate is arranged at a top of the vertical abutting plate, a second cambered notch is formed by an abutting plate, an opening portion is delimited by the first cambered notch and the second cambered notch.

12. The bearing assembly according to claim 10, wherein the oscillatory device comprises: a second drive device, a driving rotary disc, a driving shaft eccentrically penetrating the driving rotary disc, a second rolling member making rolling contact along an annular surface of the driving rotary disc, and a driving plate fixedly connected to the back plate, wherein
the second rolling member is provided with a driven shaft inserted into a pin hole formed at a bottom of the driving plate.

13. The bearing assembly according to claim 12, wherein several sliders are symmetrically arranged on one side of the back plate facing the cover plate, a middle plate fixedly connected to the cover plate is clamped between the cover plate and the back plate, and a guide rail slidably connected to the sliders is arranged on the middle plate in a vertical direction; and
a first-stage step and a second-stage step that are gradually shrunk are formed by one end of the driving shaft, the second-stage step is embedded into a limiting hole formed by the middle plate, a cylinder is formed by the other end of the driving shaft, and a pin hole for insertion of a power output shaft formed by the second drive device is formed by a circle center of the cylinder.

14. The bearing assembly according to claim 12, wherein the driven shaft comprises: a base, the base sleeving the second rolling member in an embedded manner; a retainer ring arranged on the base in a sleeving manner and stopping the second rolling member from stripping; a rotating shaft extending from the base, gradually shrunk and inserted into the pin hole; a limiting ring embedded into the pin hole and having a through hole; and a fastener,
the fastener transversely and continuously penetrating the limiting ring and the pin hole and being screwed into a blind hole provided at an end surface of the rotating shaft and having an internal thread, so as to rotatably connect the driven shaft and a driving plate.

15. The bearing assembly according to claim 14, wherein one side of a middle plate facing the oscillatory device is provided with four stand columns arranged around the driving rotary disc; and the second drive device comprises a second electric motor, a reversing device and an electric motor mounting plate, a core shaft perpendicular to the electric motor mounting plate being arranged in the reversing device, the core shaft being inserted into the pin hole, and the driving shaft being clamped by the second drive device and the middle plate.

16. The bearing assembly according to claim 12, wherein a lower limit position sensor and an upper limit position sensor are arranged on a side portion of a bottom of a middle plate, and a blocking piece is arranged at a bottom of the back plate; and
the second drive device drives the driving rotary disc to periodically rotate around the driving shaft, so as to drive the second rolling member to roll along the annular surface of the driving rotary disc by means of the driving rotary disc, so as to drive the back plate to vertically reciprocate by means of the driven shaft and a driving plate, so as to integrally drive the bearing cantilever to vertically reciprocate.

17. The bearing assembly according to claim 16, wherein the lower limit position sensor and the upper limit position sensor are movably embedded into an adjusting support arranged at a side portion of a bottom of the middle plate, the adjusting support is provided with a strip-shaped opening allowing the lower limit position sensor and the upper limit position sensor to vertically slide in a vertical direction, and an amplitude of vertical reciprocating motion of the bearing cantilever is determined by adjusting a distance between the lower limit position sensor and the upper limit position sensor.

18. The bearing assembly according to claim 10, wherein an upper surface of the bearing plate is provided with four first positioning members and four second positioning members arranged on outer sides of the first positioning members, and a positioning groove is provided on each of outer sides of the second positioning members on the bearing plate in a recessed manner.

19. The bearing assembly according to claim 10, wherein the semiconductor apparatus containment device born by the bearing assembly comprises a wafer cassette clamping a four-inch wafer, a six-inch wafer, or an eight-inch wafer, an opening for exposing the four-inch wafer, the six-inch wafer, or the eight-inch wafer being formed at a bottom of the wafer cassette.

20. A semiconductor apparatus cleaning device, comprising:
several cleaning tanks forming containment cavities, housings delimiting the cleaning tanks, and several bearing assemblies for semiconductor apparatus containment device of claim 1 fixedly connected to the housings, wherein
bearing cantilevers in the bearing assemblies for semiconductor apparatus containment devices extend into an accommodating cavities of the cleaning tanks.

* * * * *